United States Patent
Gopalan et al.

(10) Patent No.: US 9,388,268 B2
(45) Date of Patent: Jul. 12, 2016

(54) PATTERNABLE POLYMER BLOCK BRUSH LAYERS

(75) Inventors: Padma Gopalan, Madison, WI (US); Eungnak Han, Hillsboro, OR (US)

(73) Assignee: Wisconsin Alumni Research Foundation, Madison, WI (US)

( * ) Notice: Subject to any disclaimer, the term of this patent is extended or adjusted under 35 U.S.C. 154(b) by 677 days.

(21) Appl. No.: 13/270,044

(22) Filed: Oct. 10, 2011

(65) Prior Publication Data

US 2012/0116007 A1    May 10, 2012

Related U.S. Application Data

(60) Provisional application No. 61/391,978, filed on Oct. 11, 2010.

(51) Int. Cl.
| | |
|---|---|
| C08F 293/00 | (2006.01) |
| C09D 153/00 | (2006.01) |
| G03F 7/16 | (2006.01) |
| G03F 7/26 | (2006.01) |
| B82Y 40/00 | (2011.01) |

(52) U.S. Cl.
CPC ............ C08F 293/005 (2013.01); G03F 7/165 (2013.01); G03F 7/26 (2013.01); B82Y 40/00 (2013.01); C08F 2438/01 (2013.01)

(58) Field of Classification Search
CPC ............... C08F 293/00; C08F 293/005; C08F 297/026; C08F 2438/01
USPC .................................. 525/279, 280, 298, 299
See application file for complete search history.

(56) References Cited

U.S. PATENT DOCUMENTS

| 6,288,173 B1 * | 9/2001 | Schimmel et al. ............ 525/294 |
| 7,521,090 B1 | 4/2009 | Cheng et al. |
| 2003/0204033 A1 * | 10/2003 | Hamada et al. ................ 526/187 |

FOREIGN PATENT DOCUMENTS

WO    WO-2009140421 A2 * 11/2009

OTHER PUBLICATIONS

Tang, C. et al Science vol. 322 pp. 429-432, published Oct. 17, 2008.*
Mansky, P. et al Science vol. 275 pp. 1458-1460, published Mar. 7, 1997.*
PEMA definition available online at http://www.acronymfinder.com/Poly-Ethyl-Methacrylate-(PEMA).html on Nov. 2, 2014.*
Rastogi et al., "Direct Patterning of Intrinsically Electron Beam Sensitive Polymer Brushes," ACS Nano, vol. 4, No. 2, pp. 771-780, 2010.
Zhang, Jilin, et al., "Microphase Separation of Block Copolymer Thin Films," Macromol. Rapid Commun, 2010, vol. 31, pp. 591-608.
Han, Eungnak, et al., "Photopatternable Imaging Layers for Controlling Block Copolymer Microdomain Orientation," Adv. Mater., 2007, vol. 19, pp. 4448-4452.
In, Insik, et al., "Side-Chain-Grafted Random Copolymer Brushes as Neutral Surfaces for Controlling the Orientation of Block Copolymer Microdomains in Thin Films," Langmuir, American Chemical Society, Aug. 1, 2006, vol. 22, pp. 7855-7860.
Han, Eungnak, et al., "Effect of Composition of Substrate-Modifying Random Copolymer Domains," Macromolecules, 2008, vol. 41, pp. 9090-9097.
Han, Eungnak, et al. Cross-Linked Random Copolymer Mats As Ultrathin Nonpreferential Layers for Block Copolymer Self-Assemby, Langmuir, 2010, vol. 26, No. 2, pp. 1311-1315.
Zhao, Bin, et al., "Nanopattern Formation from Tethered PS-b-PMMA Brushes upon Treatment with Selective Solvents," J. Am. Chem. Soc., 2000, vol. 122, pp. 2407-2408.
Matyjaszewski, Krzysztof, et al., "Polymers at Interfaces: Using Atom Transfer Radical Polymerization in the Controlled Growth of Homopolymers and Block Copolymers from Silicon Surfaces in the Absence of Untethered Sacrificial Initiator," Macromolecules, 1999, vol. 32, pp. 8716-8724.
Han, Eungnak, et al., "Chemical Patterns from Surface Grafted Resists for Directed Assembly of Block Copolymers," ACS NANO, vol. 6, No. 2, 2012, pp. 1823-1829.

* cited by examiner

Primary Examiner — Irina S Zemel
Assistant Examiner — Jeffrey Lenihan
(74) Attorney, Agent, or Firm — Weaver Austin Villeneuve & Sampson LLP

(57) ABSTRACT

Provided are novel polymer brushes that may be used in underlying buffer or imaging layers for block copolymer lithography. The novel polymer brushes include X-A-b-B and X-A-b-C block copolymer brushes, with X an anchoring group, the A block a lithographically sensitive polymer, and the C block a random copolymer. According to various embodiments, polymer block brushes for neutral and preferential layers are provided; the neutral layers non-preferential to the overlying block copolymer and the preferential layers preferential to a block of the overlying block copolymer. Also provided are novel methods of patterning polymer block brush layers as well as polymer block brush buffer and imaging layers that are directly patternable by e-beam, deep UV, extreme UV, X-ray or other lithographic methods.

23 Claims, 16 Drawing Sheets

PATTERNABLE POLYMER BLOCK BRUSH LAYERS

CROSS-REFERENCE TO RELATED APPLICATION

This application claims the benefit under 35 USC §119(e) of U.S. Provisional Patent Application No. 61/391,978, filed Oct. 11, 2010, which is incorporated by reference herein in its entirety.

STATEMENT OF GOVERNMENTAL SUPPORT

This invention was made with government support under 0832760 awarded by the National Science Foundation. The government has certain rights in the invention.

BACKGROUND OF THE INVENTION

Patternable polymer brush layers may be used as underlayers for the self-assembly of Nock copolymers (BCPs). Self-assembly of block copolymer materials (BCPs) in bulk and the translation of ordered block copolymer domains into thin-films has emerged as a powerful approach to create functional nanostructures and templates for various applications. Block copolymer lithography refers to the use of ordered block copolymer domains in thin-film form as templates for patterning, e.g., through selective etching or deposition. The resulting nanostructures, such as dense periodic arrays, may be used in applications such as bit patterned media, FLASH memory, nanowire transistors, quantum dot arrays, separation membranes, photonic crystals and photovoltaic cells. Self-assembly of BCPs in thin-films form may involve depositing a BCP solution on a patterned buffer or imaging layer on a substrate, then inducing the BCP to separate into domains.

SUMMARY OF THE INVENTION

Provided are novel polymer brushes that may be used in underlying buffer or imaging layers for block copolymer lithography. The novel polymer brushes include X-A-b-B and X-A-b-C block copolymer brushes, with X an anchoring group, the A block a lithographically sensitive polymer, and the C block a random copolymer. According to various embodiments, polymer block brushes for neutral and preferential layers are provided; the neutral layers non-preferential to the overlying block copolymer and the preferential layers preferential to a block of the overlying block copolymer. Also provided are novel methods of patterning polymer block brush layers as well as polymer block brush buffer and imaging layers that are directly patternable by e-beam, deep UV, extreme UV, X-ray or other lithographic methods.

One aspect of the invention relates to block copolymer brushes having a terminal B block; a lithographically-sensitive A block, and a terminal anchoring group, wherein the average molecular weight of the block copolymer is between about 10 and 80 kg/mol and the B block fraction in the block copolymer is between about 0.3 and 0.9. These may be referred to as Type I block brushes.

As used herein, "lithographically-sensitive" refers to polymers that are sensitive to one or more of e-beam, deep UV, extreme UV (EUV), X-ray patterning or other radiation patterning technique such that exposure to the radiation results in modification and/or removal of the polymer. In certain embodiments, the A block is a methacrylate-containing polymer such as PMMA, PHEMA, PHEMA-TMS, PIBMA, PNPMA or PTFEMA.

The B block may be any polymer of interest. In certain embodiments, the block is tailored to interact one of the blocks of BCP to be deposited on a buffer layer of the polymer brushes, and may be the same polymer as one of the blocks of the BCP. Non-limiting examples include polystyrene (PS), poly(2-vinylpyridine) (P2VP), poly(4-vinylpyridine) (PV4P), polyethylene oxide (PEO), and polydimethylsiloxane (PDMS).

The anchoring group is configured to anchor the block brush to a substrate. Examples of anchoring groups include substituted or unsubstituted hydroxyl groups, thiol groups, azide groups, carboxylic acid groups, amide groups, epoxide groups, vinyl groups and trichlorosilane groups.

In certain embodiments, the average molecular weight of the block copolymer is less than about 30 kg/mol, for example less than about 25 kg/mol, or less than 20 kg/mol. In these embodiments, the B block fraction in the block copolymer is greater than 0.5. In other embodiments, the average molecular weight of the block copolymer is greater than about 30 kg/mol, for example greater than about 40 kg/mol, greater than about 50 kg/mol, greater than about 60 kg/mol, or greater than about 70 kg/mol. In these embodiments, the B block fraction may be between about 0.3 and 0.9. This includes embodiments in which the B block fraction is between about 0.3 and 0.4, 0.3 and 0.5, 0.4 and 0.5, between about 0.5 and 0.6, between about 0.6 and 0.7, between about 0.7 and 0.8, and between about 0.8 and 0.9, though other ranges are possible. In certain embodiments the block copolymer brushes are attached via the anchoring groups to a substrate, e.g., a silicon substrate.

Another aspect of the invention relates to block copolymer brushes having a terminal B block; a lithographically-sensitive A block, and a terminal anchoring group, wherein the average molecular weight of the block copolymer is between about 2 and 30 kg/mol and the B block fraction in the block copolymer is between about 0.15 and 0.4. These may be referred to as Type II brushes. In some embodiments, the B block fraction is between about 0.15 and 0.3.

The A block is sensitive to one or more of e-beam, deep UV, extreme UV (EUV), X-rays or other patterning technique such that exposure results in modification of the block. In certain embodiments, the A block is a methacrylate-containing polymer such as PMMA, PHEMA, PHEMA-TMS, PIBMA, PNPMA or PTFEMA.

The B block may be any polymer of interest. In certain embodiments, the block is tailored to interact one of the blocks of BCP to be deposited on a buffer layer of the polymer brushes, and may be the same polymer as one of the blocks of the BCP. Non-limiting examples include polystyrene (PS), poly(2-vinylpyridine) (P2VP), poly(4-vinylpyridine) (PV4P), polyethylene oxide (PEG), and polydimethylsiloxane (PDMS).

Examples of anchoring groups include substituted or unsubstituted hydroxyl groups, thiol groups, azide groups, carboxylic acid groups, amide groups, epoxide groups, vinyl groups and trichlorosilane groups.

In certain embodiments, the average molecular weight of the block copolymer is about 25 kg/mol or less or about 20 kg/mol or less. This includes ranges in which the average molecular weight is between about 2 kg/mol and 20 kg/mol, 5 kg/mol and 25 kg/mol, between about 10 kg/mol and 20 kg/mol, between about 15 and 25 kg/mol, and between about 10 and 25 kg/mol, though other ranges are possible.

In certain embodiments, the B block fraction is less than about 0.35, or less than about 0.3, or less than about 0.25, or less than about 0.2, though other ranges are possible. In certain embodiments the block copolymer is attached via the anchoring group to a substrate, e.g., a silicon substrate.

Another aspect of the invention relates to block copolymers having a terminal C block; a lithographically-sensitive A block, and a terminal anchoring group, wherein the C is block is an PB-r-PD random copolymer, and wherein the average molecular weight of the block copolymer is between about 10 and 80 kg/mol, the C block fraction in the block copolymer is between about 0.4 and 0.9 and the B fraction in the C block is between about 0.1 and 0.9. These may be referred to as Type III brushes.

The A block is sensitive to one or more of e-beam, deep UV, extreme UV (EUV), X-rays or other patterning technique such that exposure results in modification of the block. In certain embodiments, the A block is a methacrylate-containing polymer such as PMMA, PHEMA, PHEMA-TMS, PIBMA, PNPMA or PTFEMA. Examples of anchoring groups include substituted or unsubstituted hydroxyl groups, thiol groups, azide groups, carboxylic acid groups, amide groups, epoxide groups, vinyl groups and trichlorosilane groups.

The C block is a PB-r-PD random copolymer. In certain embodiments, the PB and PD random copolymers are the components of a BCP to be deposited on a buffer layer of the Type III block brushes, e.g., a PB-b-PD diblock copolymer. For example, for a buffer layer for PS-b-P2VP, the C block may be a PS-r-P2VP random copolymer. Either component may be considered the "B" or "D" component. Examples of BCP's relevant for BCP lithography include PS-b-PMMA, PS-b-P2VP, PS-b-P4VP, PS-b-PEO, PS-b-PDMS, and PS-b-PEMA; the C block may be tailored accordingly.

In certain embodiments, the average molecular weight of the block copolymer is less than about 30 kg/mol, for example less than about 25 kg/mol, or less than 20 kg/mol. In other embodiments, the average molecular weight of the block copolymer is greater than about 30 kg/mol, for example greater than about 40 kg/mol, greater than about 50 kg/mol, greater than about 60 kg/mol, or greater than about 70 kg/mol.

The C block fraction is between about 0.4 and 0.9. This includes embodiments in which the C block fraction is between about 0.4 and 0.5, 0.5 and 0.6, 0.6 and 0.7, 0.7 and 0.8, and 0.8 and 0.9, though other ranges are possible. The B fraction in the C block is between about 0.1 and 0.9. This includes embodiments in which the B fraction in the C block is between about 0.1 and 0.2, 0.2 and 0.3, 0.4 and 0.5, 0.5 and 0.6, 0.6 and 0.7, 0.7 and 0.8, and 0.8 and 0.9, though other ranges are possible. In certain embodiments the block copolymer is attached via the anchoring group to a substrate, e.g., a silicon substrate.

Another aspect of the invention relates to layers made up of block brushes described herein grafted to a substrate to form a polymer brush layer. In certain embodiments, these are buffer or imaging layers configured for block copolymer (BCP) deposition and assembly.

Yet another aspect of the invention relates to resist-free methods of patterning a preferential buffer layer, involving attaching a plurality of block copolymer brushes described herein to a substrate surface via their anchor molecules to form a buffer layer of block copolymer brushes; and exposing areas of the buffer layer to one of an e-beam, deep UV, EUV or X-ray to remove or modify the block brushes in the exposed areas, thereby patterning the buffer layer. In certain embodiments, the block copolymer brushes are Type I brushes. In certain embodiments, the methods further involve depositing a block copolymer composition on the patterned buffer layer.

Yet another aspect of the invention relates to resist-free methods of patterning a non-preferential buffer layer, involving attaching a plurality of block copolymers described herein to a substrate surface via their anchor molecules to form a buffer layer of block copolymer brushes; and exposing areas of the non-preferential buffer layer to e-beam, deep UV, EUV or X-ray to remove or modify the block brushes in the exposed areas, thereby patterning the buffer layer. In certain embodiments, the block copolymer brushes are Type II or Type III brushes. In certain embodiments, the methods further involve depositing a block copolymer composition on the buffer layer, the buffer layer non-preferential to the blocks of the block copolymer composition.

DETAILED DESCRIPTION

Introduction

Figure 1:
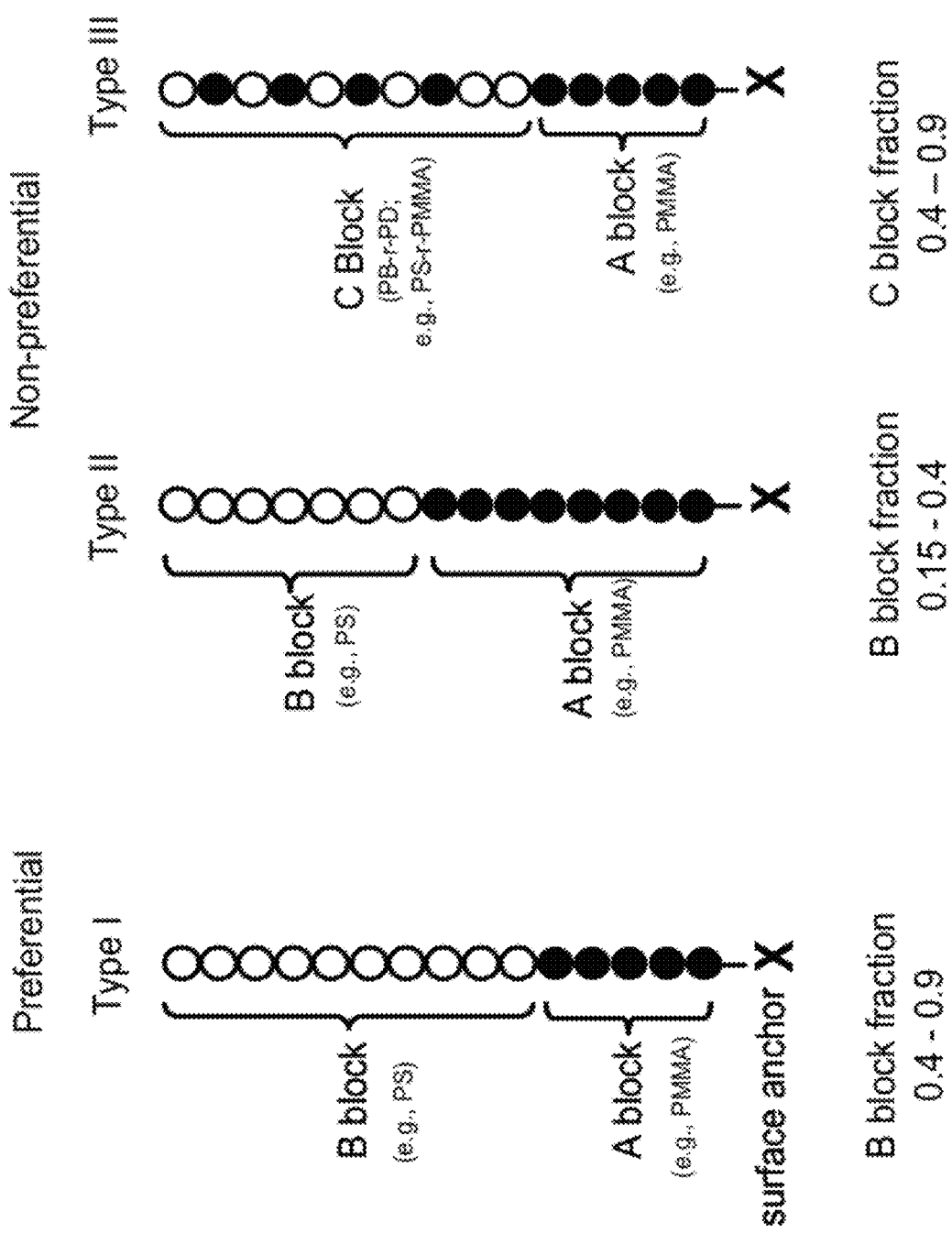
FIG. 1 provides structures of Type I, II and III block copolymer brushes according to various embodiments.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. For example, while the description below refers to the block brushes described herein in the context of directly patternable layers that provide surfaces for the self-assembly of BCPs, applications of the block brushes are not so limited. Moreover, within the context of BCP assembly and lithography, examples of polymer components of the block brushes are discussed below; one of skill in the art will understand from the description provided herein how to incorporate other polymer components into the block brushes. In the following description, numerous specific details are set forth in order to provide a thorough understanding of the present invention. The present invention may be practiced without some or all of these specific details.

Provided herein are directly patternable block brushes and methods of patterning the block brushes. In certain embodiments, the block brushes provide a surface for the self-assembly of block copolymers. According to various embodiments, preferential and non-preferential block brushes and surfaces are provided.

Self-assembly of block copolymer (BCPs) materials in the bulk and translation of these ordered domains into thin-films has emerged as a powerful approach to create functional nanostructures and templates for various applications. Block copolymer self-assembled domains include spheres, cylinders, and lamellae that can be used to form dense arrays of dots, lines, spaces, and irregular features (junctions, elbows, jogs, etc.) in thin films. In thin films, controlling the orientation of domains with respect to the substrate dictates the pattern geometry for anisotropic domains such as cylinders and lamellae. Provided herein are polymer brushes that induce perpendicular orientation of a block copolymer material to the substrate.

Embodiments of the present invention combine "bottom up" and "top down" approaches into a single system having (i) polymer chemistry that can be synthesized or tailored for most BCP-lithography-relevant block copolymers, and (ii) sufficient sensitivity to enable direct patterning. Examples of BCP-lithography-relevant block copolymers include PS-b-PMMA, PS-b-P2VP, PS-b-P4VP, PS-b-PEO, PS-b-PDMS, and PS-b-PEMA; one of skill in the art will understand from the description provided herein how to tailor the block brushes described herein for any desired chemistry. Because the polymer brushes are directly patternable by e-beam, EUV, or other lithographic methods, multi-step patterning techniques (e.g., photoresist application, selective etching and oxygen plasma treatment) required by conventional systems are avoided in certain embodiments. These and other features are described further below.

Figure 2:
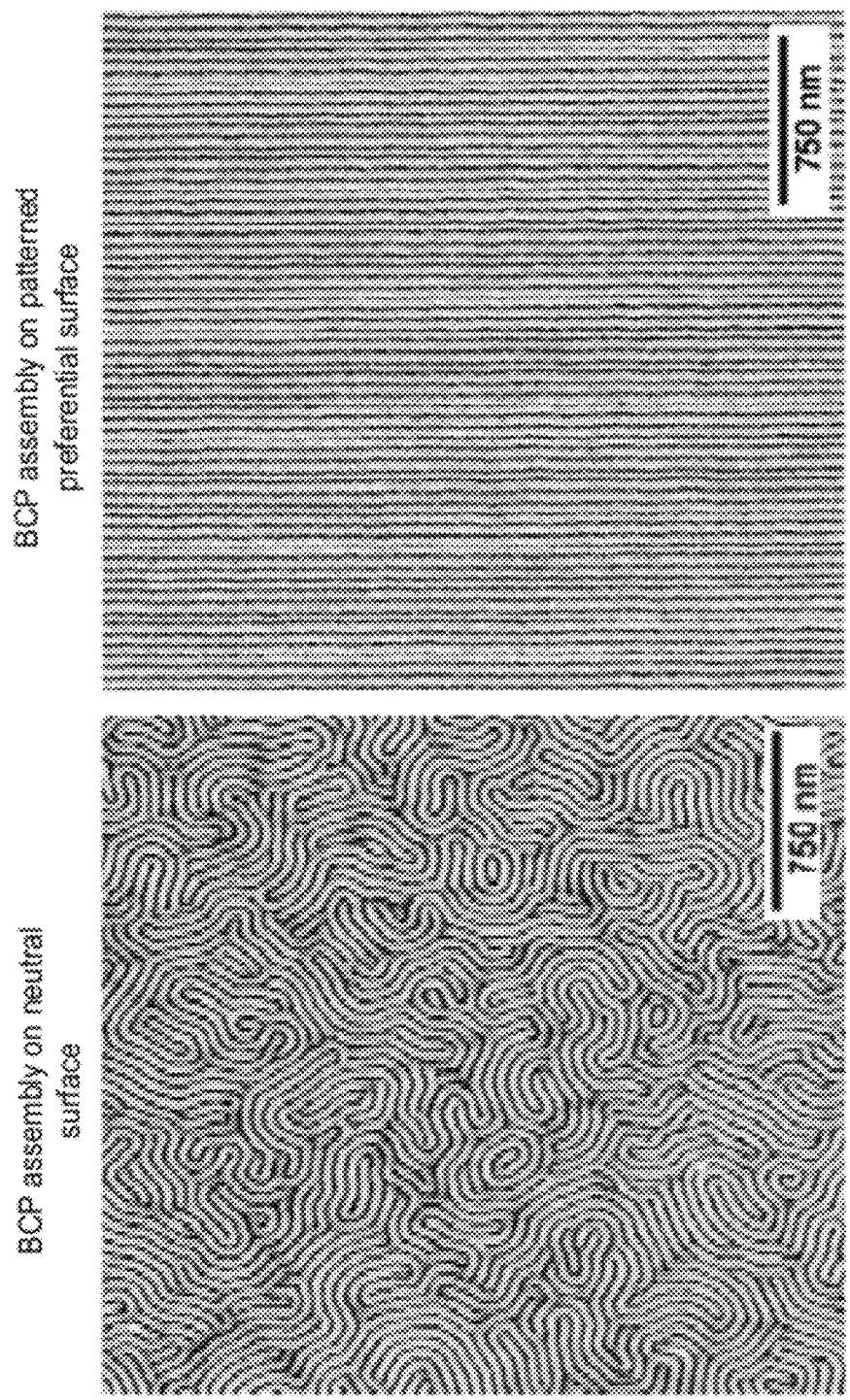
FIG. 2 shows top down SEM images illustrating BCP assembly on a neutral (non-preferential) surface and on a patterned preferential surface.

As indicated above, the directly patternable copolymers described herein induce perpendicular orientation of block copolymer domains with respect to the substrate. FIG. 1 provides schematic generic structures of block polymer brushes according to various embodiments, labeled as Type I, Type II and Type III block brushes. Type I may be used to form layers preferential to an overlying block copolymer material, and Types II and III to form layers non-preferential to an overlying block copolymer. FIG. 2 provides examples of macroscopic self-assembly of a BCP on a neutral surface and on a patterned preferential surface. The neutral surface, which can be formed from Type II and Type III block copolymers described herein, results in disordered assembly of the block copolymer. The preferential surface, which can be formed from Type I block copolymers described herein, results in ordered assembly of the block copolymer.

According to certain embodiments, Type I brushes (X-A-b-B) are characterized by an anchoring group X, a single terminal B-block and a single A-block linking the anchoring group and the B-block, with the B-block fraction between about 0.4-0.9. The A-block is a lithographically sensitive block, e.g., poly(methyl methacrylate) (PMMA) and the B-block preferential to one of the blocks of the block copolymer to be deposited. In FIG. 1, the B-block is polystyrene (PS), preferential to PS blocks of a PS-containing block copolymer, e.g., PS-b-PMMA. As is further described below, Type I brushes may be used to form chemical patterns that directly guide the self-assembly of overlying block copolymer domains into ordered components. In certain embodiments, Type I brushes are further characterized by a number average molecular weight ($M_n$) of between about 10 kg/mol and 80 kg/mol. In certain embodiments, $M_n$ of block brush is such that phase separation does not occur, e.g., less than about 30 kg/mol. In these embodiments, the B block fraction is higher than about 0.5. In certain embodiments, the $M_n$ is such that phase separation occurs in a brush layer, e.g., higher than about 30 kg/mol. In these embodiments, the B block fraction may vary between about 0.1 and 0.9.

According to certain embodiments, Type II brushes (X-A-b-B) are characterized by an anchoring group X, a single terminal B-block and a single A-block linking the anchoring group and the B-block, with the B-block fraction between about 0.4-0.9. The A-block is a lithographically sensitive block, such as PMMA, and the B-block is any appropriate homopolymer; in certain embodiments one of the blocks of an overlying diblock copolymer. In FIG. 1, the B-block is PS. The X-PMMA-PS brush depicted in FIG. 1 may be used as a non-preferential buffer layer for deposition of PS-b-PMMA having perpendicularly oriented domains, for example. In certain embodiments, Type II brushes are further characterized by a number average molecular weight ($M_n$) low enough that phase separation does not occur. In certain embodiments, Type II brushes are characterized by a $M_n$ of between about 2 kg/mol and 30 kg/mol. This includes Type II brushes having an $M_n$ between about 2 kg/mol and 20 kg/mol, e.g., 2 kg/mol and 15 kg/mol, or between about 5 kg/mol and 10 kg/mol.

According to certain embodiments, Type III brushes (X-A-b-C; C is an PB-r-PD random copolymer) are characterized by an anchoring group X, a single terminal C-block and a single A block linking the anchoring group and the C-block, with the C-block fraction between about 0.4 to 0.9. The A-block is a lithographically sensitive block, such as PMMA. The C-block is a random copolymer PB-r-PD, in certain embodiments tailored for BCP deposition. In certain embodiments, the B and D monomers are the monomer components of an overlying block copolymer PB-b-PD block copolymer.

In certain embodiments, one of the monomer types in the C block is the same as the A-block, though this is not necessarily the case. For example, in one embodiment a Type III brush is OH-PMMA-b-(PS-r-PMMA), with X an OH group, the A block a PMMA block, and the C block a PS-r-PMMA copolymer. Another example of a Type III block brush is OH-PMMA-b-(PS-r-P4VP), e.g., for a PS-b-P4VP overlying layer.

The B fraction in the C block is between about 0.1 and 0.9. In certain embodiments, Type III brushes are characterized by a $M_n$ of between about 10 k and 80 k. Type II and Type III brushes may be used in certain embodiments to achieving perpendicular domain orientation of an overlying BCP by balancing out the interactions of each block of the BCP with the substrate.

While example ranges of the preferential and non-preferential block copolymer brushes are described above, these ranges can overlap depending on the brush composition, molecular weight, and BCP or BCP blend to be assembled. For example, in some instances, an X-A-b-B block copolymer brush can be preferential (Type I) for B block fractions of about 0.3 and higher and non-preferential (Type II) for B block fractions of less than about 0.3. In some instances, an X-A-b-C; C is B-r-D block copolymer brush can have a C block fraction of about 0.3 or above. Further, as discussed below, in some instances an upper limit on the B fraction in X-A-b-B block copolymers and the C fraction in X-A-b-C block copolymers can be imposed by the potential for patterning-induced crosslinking reactions. For example, where B is PS, in some instances B fractions in Type I block copolymers greater than about 0.75 may result in blurred or incoherent patterns.

As indicated above, the A-block in the Type I, Type II and Type III block brushes described above is a lithographically-sensitive block. According to various embodiments, it is sensitive to one or more of electron beam (e-beam), deep ultraviolet (UV), extreme ultraviolet (UN) and X-ray radiation. Examples of such polymers include methacrylate-containing brushes, including PMMA, poly(2-hydroxyl methacrylate) (PHEMA), poly(isobutyl methacrylate) (PIBMA), poly(neopentyl methacrylate) (PNPMA), and poly(2,2,2-trifluoroethyl methacrylate) (PTFEMA). PMMA, PHEMA, PIBMA, PNPMA and PTFEMA brushes have been shown to be e-beam sensitive by Rastogi et al., Direct Patterning of intrinsically Electron Beam Sensitive Polymer Brushes, ACS Nano, vol. 4, No. 2, pp. 771-780, 2010, incorporated by reference herein. As described therein, e-beam exposure of methacrylate polymer brush systems degrades the brushes forming main chain radicals (e.g., $.CH_3$ from PMMA; $.CH_2CH(CH_3)_2$ from PIBMA, etc.) and R. radicals from the COOR groups, with the e-beam sensitivity of the correlated to the stability of main chain radicals and R. radicals. As a result, highly e-beam sensitive brushes may be tailor made by modifying the β-position to the carbonyl group. Methacrylate-containing brushes are also sensitive to ultraviolet radiation.

The B-block or C-block in the block copolymers described above may be tailored for a desired preferential or non-preferential interaction with an overlying BCP to be deposited and assembled on a block brush layer as described herein. The anchoring group, X, is any group that can be surface-grafted and attached to the A-block of the polymer brush. Examples include a hydroxyl group, a thiol group, an azide group, a carboxylic acid group, an amide group, an epoxide group, a vinyl group, a trichlorosilane group.

According to various embodiments, the molecular weights of the block copolymer brushes are as described above. The block brushes may also be characterized by weight average molecular weights ($M_w$) of the same ranges. In certain embodiments, the block brushes are further characterized be relatively low PDI's of about 1.15 or below, or about 1.1. or below, though the block brushes having higher PDI's are also within the scope of the invention.

Directly Patternable Polymer Brushes for Non-Preferential Layers

Figure 3A:
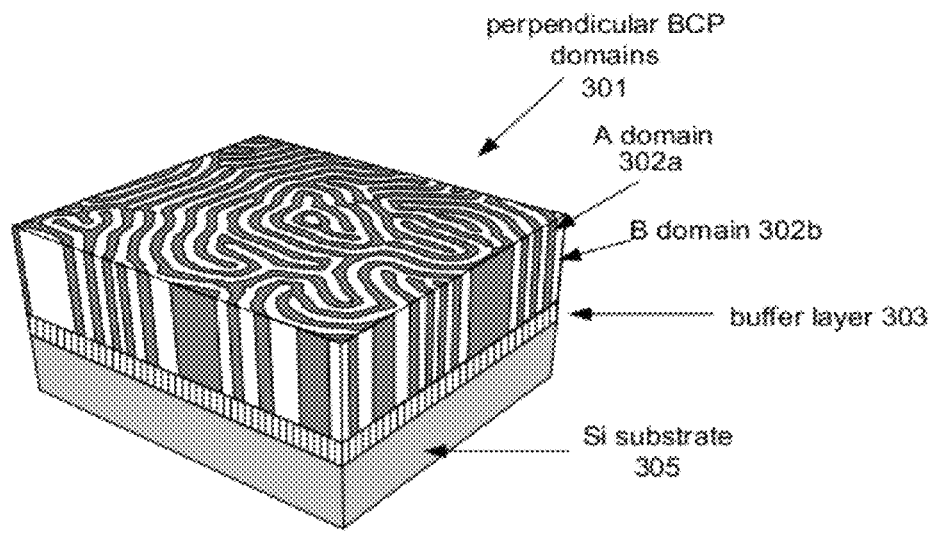
FIG. 3a is a schematic representation of a BCP film assembled on a buffer layer coated substrate such that the BCP domains are oriented perpendicular to the substrate.

As indicated above, Type II and Type III polymer brushes are used in certain embodiments to form non-preferential or neutral surfaces for the deposition of BCPs. In thin films, controlling the orientation of BCP domains with respect to the substrate is dictates the pattern geometry for anisotropic domains such as cylinders and lamellae. One method of achieving perpendicular domain orientation is to balance out the interfacial interactions of each block of the BCP with the substrate. This is sometimes referred to as the "neutral surface." FIG. 3a schematically illustrates a BCP thin-film 301 having perpendicularly-oriented domains 302a and 302b on a silicon substrate 305. Buffer layer 303 provides a neutral surface that induces perpendicular orientation of the BCP domains 302a and 302b. As discussed further below, a non-preferential buffer layer can be patterned in a pattern defined by non-preferential areas and preferential areas; the non-preferential areas inducing perpendicular orientation and the preferential areas inducing parallel orientation of the BCP domains.

Surface neutralization using polymer brushes has been reported by Mansky et al., Controlling polymer-surface interactions with random copolymer brushes. *Science* 1997, 275, (5305), 1458-1460, incorporated by reference herein for all purposes. They demonstrated that the interfacial interaction of polystyrene-block-poly(methyl methacrylate) (PS-b-PMMA) with the substrate can be tuned by controlling the composition of surface grafted PS-r-PMMA brush. In using such a brush as a buffer layer for BCP deposition, the result is a surface which has a random distribution of comonomers on the surface so that both the local and global composition is uniformly defined to tune the interactions with the overlying BCP film. However, these films are not directly patternable.

Embodiments of the present invention provide low molecular weight anchor-group terminated Type II block copolymers (X-A-b-B) anchored to the surface as a non-preferential buffer layer for the assembly of BCP's in thin films. Embodiments of the present invention also provide anchor-group terminated Type III block copolymers (X-A-b-C) where the C block is a B-r-D random copolymer.

Figure 3B:
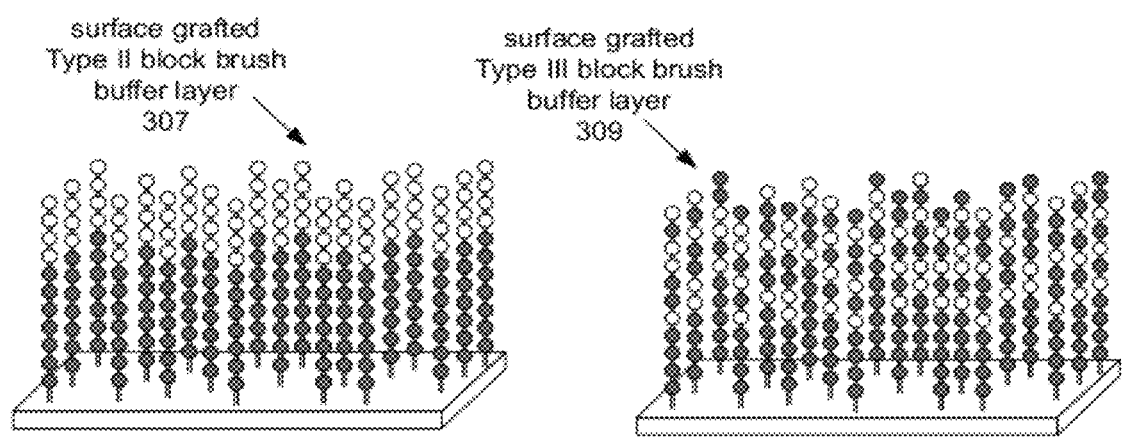
FIG. 3b is a schematic representation of non-preferential block brush buffer layers according to certain embodiments.

In certain embodiments, the Type I low molecular weight anchor-group terminated block copolymers (X-A-b-B) anchored to the surface form a non-preferential buffer layer for the assembly of BCP's in thin film higher molecular weight A-b-B diblocks, or other B-containing diblocks. In certain embodiments, the Type III anchor-group terminated block copolymers (X-A-b-C, C is B-r-D) anchored to the surface form a non-preferential buffer layer for the assembly of BCP's in thin film higher molecular weight B-b-D diblocks. FIG. 3b schematically depicts non-preferential buffer layers of surface-anchored Type II block copolymers at 307 and surface-anchored Type III block copolymers at 309. Advantages of these block copolymer brushes include in certain embodiments (i) they can be readily synthesized for most copolymers relevant to BCP lithography, and (ii) the block architecture provides sufficient sensitivity in these brushes to enable direct electron beam or other patterning.

For example, non-preferential surfaces can be created by surface-anchored low molecular weight PS-b-PMMA-OH brushes for both symmetric and asymmetric PS-b-PMMA. Similarly, non-preferential surfaces can be created by surface-anchored low molecular weight X-A-b-B brushes for symmetric and asymmetric A-b-B block copolymers. Non-preferential surfaces can be created by surface-anchored (PS-r-PMMA)-b-PMMA-OH brushes for both symmetric and asymmetric PS-b-PMMA. Similarly, non-preferential surfaces can be created by surface-anchored low molecular weight X-A-b-(B-r-D) brushes for symmetric and asymmetric B-b-D block copolymers.

Unlike random copolymer polymeric brushes that have been used to generate neutral surfaces, the block brushes described herein are directly patternable using a patterning technique such as e-beam lithography to locally shave the brushes resulting in spatial control of domain orientation in the overlying BCP film. Thus, in certain embodiments, features of "bottom up" and "top down" approaches are effectively combined in the block architecture of the buffer layer as it functions as a (i) non-preferential layer to dictate perpendicular orientation of BCP domains from the substrate interface, and (ii) an e-beam resist to spatially to allow a top-down lithographic process to define the non-preferential layer on the substrate.

Directly Patternable Polymer Brushes for Preferential Layers

As indicated above, Type I polymer brushes are used in certain embodiments to form patterned preferential surfaces for the deposition of BCPs. BCPs have a bulk length scale $L_o$; for lamella-forming diblock copolymers, $L_o$, is the width of one diblock or two stripes in the bulk. For hexagonally-arrayed cylindrical and spherical domain structures, the periodicity of the bulk domain structures can be characterized by the distance between the cylinders or spheres in the hexagonal array. BCPs can be directed to assemble by a preferential pattern to replicate the pattern, if the pattern dimensions ($L_s$) are approximately equal to or commensurate with $L_o$.

Figure 4A:
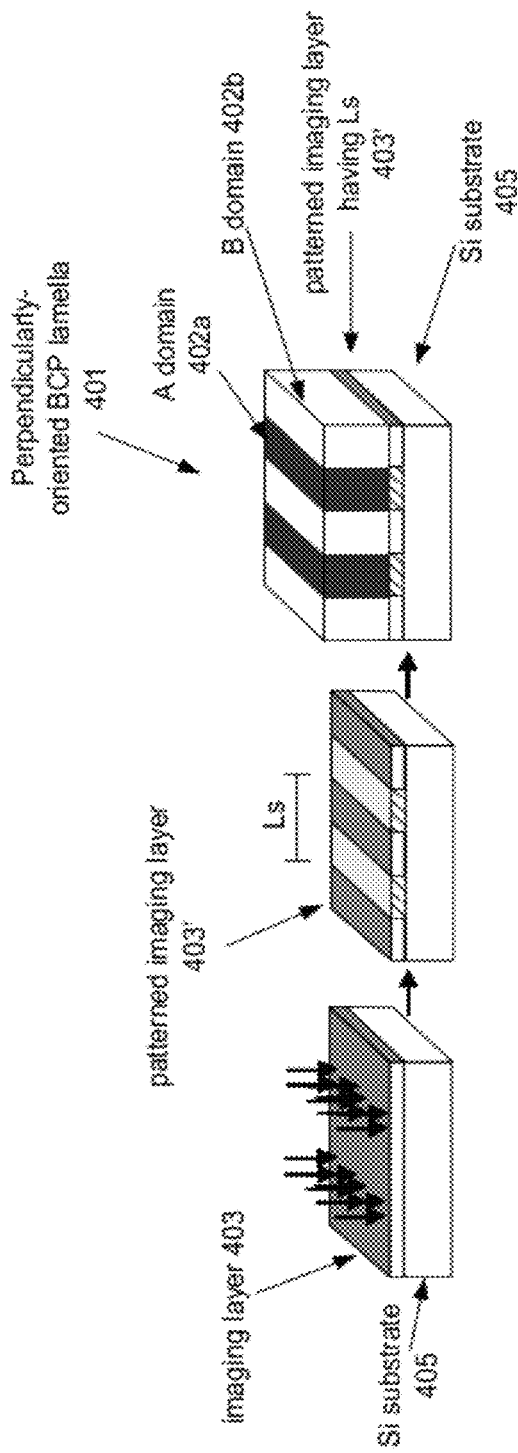
FIG. 4a is a schematic representation of patterning an imaging layer and assembling ordered BCP films on it according to certain embodiments.
Figure 4B:
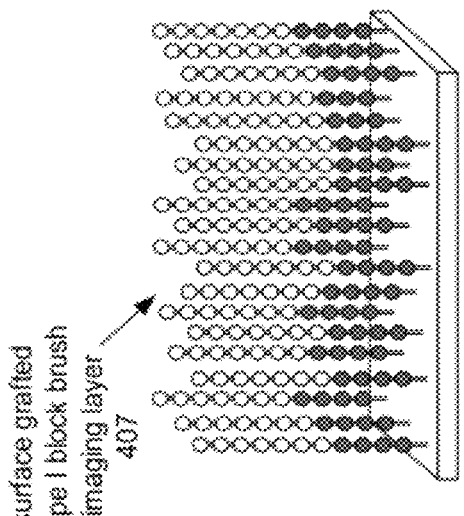
FIG. 4b is a schematic representation of a preferential block brush buffer layer according to certain embodiments.

FIG. 4a schematically illustrates patterning an imaging layer 403 to create a patterned imaging layer 403'. In this example, a pattern of alternating stripes having a length scale $L_s$ is shown. A BCP thin-film 401 having perpendicularly-oriented lamellar domains 402a and 402b is directed to assemble by the patterned imaging layer 403'. The bulk length scale of the BCP, $L_o$, is commensurate with $L_s$. Directed assembly of BCP's by chemically patterned substrates is discussed in U.S. Patent Publication Nos. 2006/0134556; 2009/0087653; 2009/0087664; 2008/0299353; and 2009/0196488; all of which are incorporated by reference herein.

Embodiments of the present invention provide low molecular weight anchor-group terminated Type I block copolymers (X-A-b-B) anchored to the surface as a preferential imaging layer for the directed assembly of BCP's in thin films. The X-A-b-B block copolymer is preferential to one of the components of the BCP; in certain embodiments, the B block of the X-A-b-B block copolymer is preferential to one of the components of the BCP. In certain embodiments, the Type I anchor-group terminated block copolymers (X-A-b-B) anchored to the surface form a preferential imaging layer for the assembly of BCP's in thin film higher molecular weight A-b-B diblocks, or other B-containing diblocks. Because the Type I X-A-b-B block copolymers are preferential to one of the blocks of the overlying BCP, if patterned at a length scale commensurate with that of the bulk BCP, the Type I X-A-b-B block brushes can drive the assembly of ordered domains of the BCP.

FIG. 4h schematically depicts an imaging layer of surface-anchored Type I block copolymers at 409. Advantages of these block copolymer brushes include, in certain embodiments (i) they can be readily synthesized for most copolymers relevant to BCP lithography, and (ii) the block architecture provides sufficient sensitivity in these brushes to enable direct electron beam or other patterning.

Patterning

As indicated above, the block brushes described herein are directly patternable by one or more of e-beam, deep UV, HIV or X-ray lithography. Any method that can directly pattern an X-A homopolymer brush may be implemented with the Type I, II and III X-A-b-B and X-A-b-C block copolymer brushes described herein.

Figure 5:
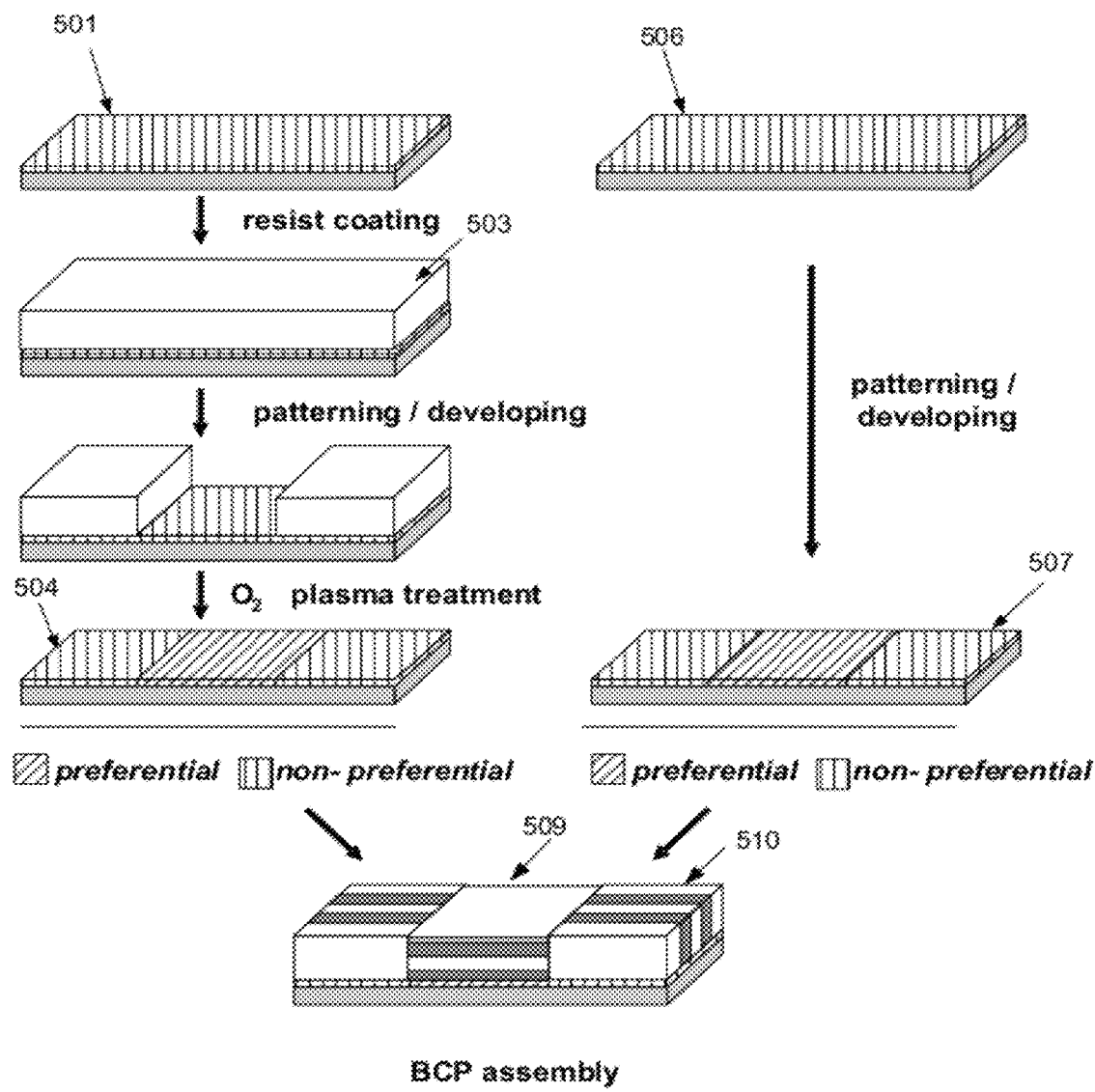
FIG. 5 is a schematic representation of indirect patterning, using resists, and resist-free direct patterning of a non-preferential buffer layer and subsequent BCP assembly according to certain embodiments.

Non-direct patterning methods employed to pattern previous underlying layers for BCP deposition generally use chemical resists; in certain embodiments block copolymer brushes described herein are directly patternable and do not need resists. FIG. 5 is a schematic of (a) chemical patterning of random copolymer brushes and (b) direct chemical patterning of block copolymer brushes according to the embodiments described herein. On the left, a process flow for patterning a non-preferential buffer layer of random copolymer brushes 501 is shown. The buffer layer 501 is coated with a chemical resist 503, which is then patterned (e.g., by exposure to UV, etc.) and developed, exposing the buffer layer 501 in the desired pattern. The physical pattern of the resist layer generated by the lithographic process is transferred to the chemical pattern by exposure to an oxygen plasma environment, creating a patterned buffer layer 504. By doing so, the non-preferential layer in the unexposed region is protected by the remaining overlying resist while the exposed region becomes more polar, and preferential to one of the blocks of the BCP to be deposited thereon. On the right, direct patterning of a buffer layer 506 of Type II block copolymers is shown. In other embodiments, layer 506 is a layer of Type III block copolymers. The Type II or Type III block copolymers of buffer layer 506 are directly exposed to an e-beam in the area desired to be preferential. Upon exposure to e-beam, the A block in the brush undergoes a chain scission reaction, resulting in cleavage of the block brush from the substrate upon subsequent washing. The result is a directly patterned buffer layer 507, having preferential and non-preferential areas. Assembly of a BCP on the directly patterned buffer layer 507 is the same as that on patterned buffer layer 504: perpendicular-oriented domains 510 on the non-preferential regions of the pattern, and parallel-oriented domains 509 on the preferential regions.

Although direct patterning of Type II and Type III block brushes can successfully controls the orientation of BCP domain with respect to the substrate, there is a lack of long-range order as the grain is randomly oriented in the lateral direction, as depicted in FIGS. 2 and 3a. In certain embodiments, graphoepitaxy technique or other known techniques are used to impose a high degree of lateral order. Graphoepitaxy uses a sub-micron groove as a substrate; the spatial confinement of the BCP within the groove induces nucleation and propagation of microdomains from the confining hard walls. See, e.g., Segalman, R. A.; Yokoyama, H.; Kramer, E. J., Graphoepitaxy of spherical domain block copolymer films. *Advanced Materials* 2001, 13, (15), 1152-+, incorporated by reference herein, for a discussion of inducing lateral order via graphoepitaxy. This process provides resolution enhancement from a sub-micron grove to a few tens of nanometers using BCP assembly.

Figure 6A:
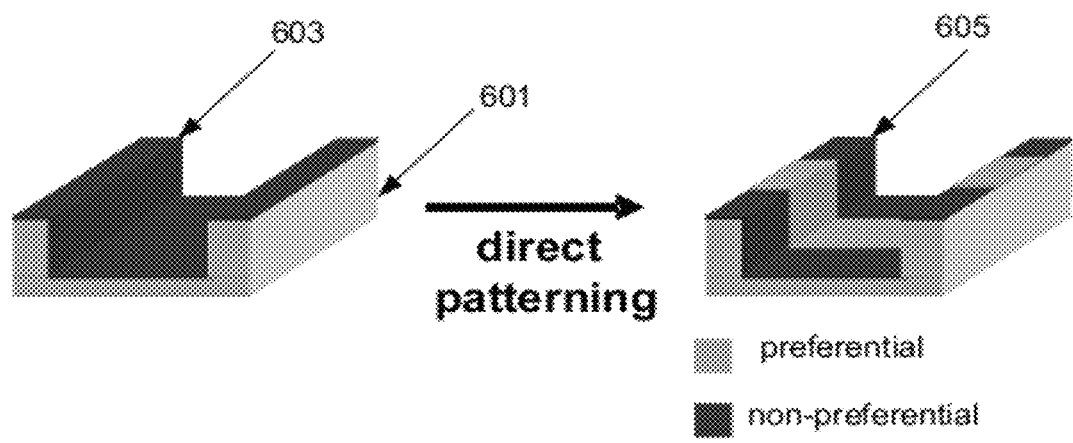
FIG. 6a is a schematic representation of direct patterning of a topographic surface according to certain embodiments.

FIG. 6a includes a schematic illustration of direct chemical patterning of topographic feature; substrate 601 includes a trench, A Type II or Type III block copolymer brush buffer layer 603 coats the substrate 601 including the trench. The buffer layer 603 is patterned to form patterned buffer layer 605, in which alternating preferential and non-preferential regions extend across the trench. An assembled BCP film (not shown) is induced to order by the trench walls.

Figure 6B:
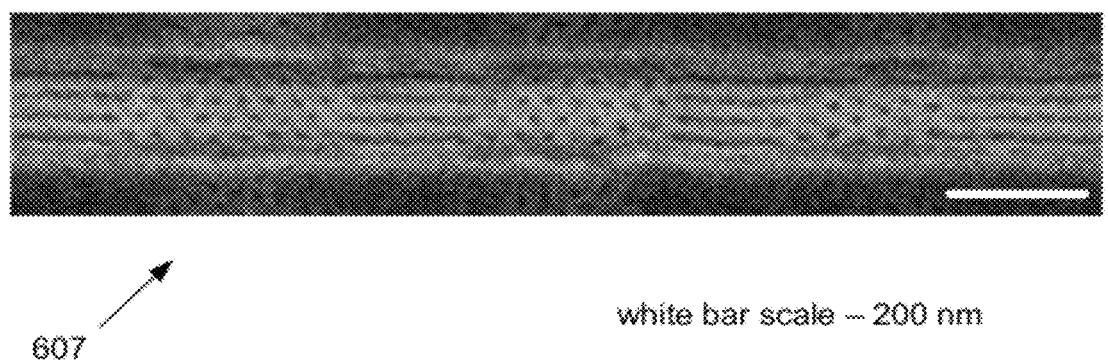
FIG. 6b is a top down SEM image of a BCP thin film assembled into alternating domains of aligned lines and arrays of dots formed within a trench.

In certain embodiments, line and dot patterns are generated side-by-side using a cylinder-forming BCP and alternating the neutrality of the substrate from preferential to non-preferential, as shown in FIG. 5. Assembled cylindrical domains are parallel in the preferential areas (creating a line pattern) and perpendicular in the non-preferential areas (creating a dot pattern.). FIG. 6b shows an SEM image of a BCP thin film assembled into alternating domains of aligned lines and arrays of dots formed within a trench.

Figure 7:
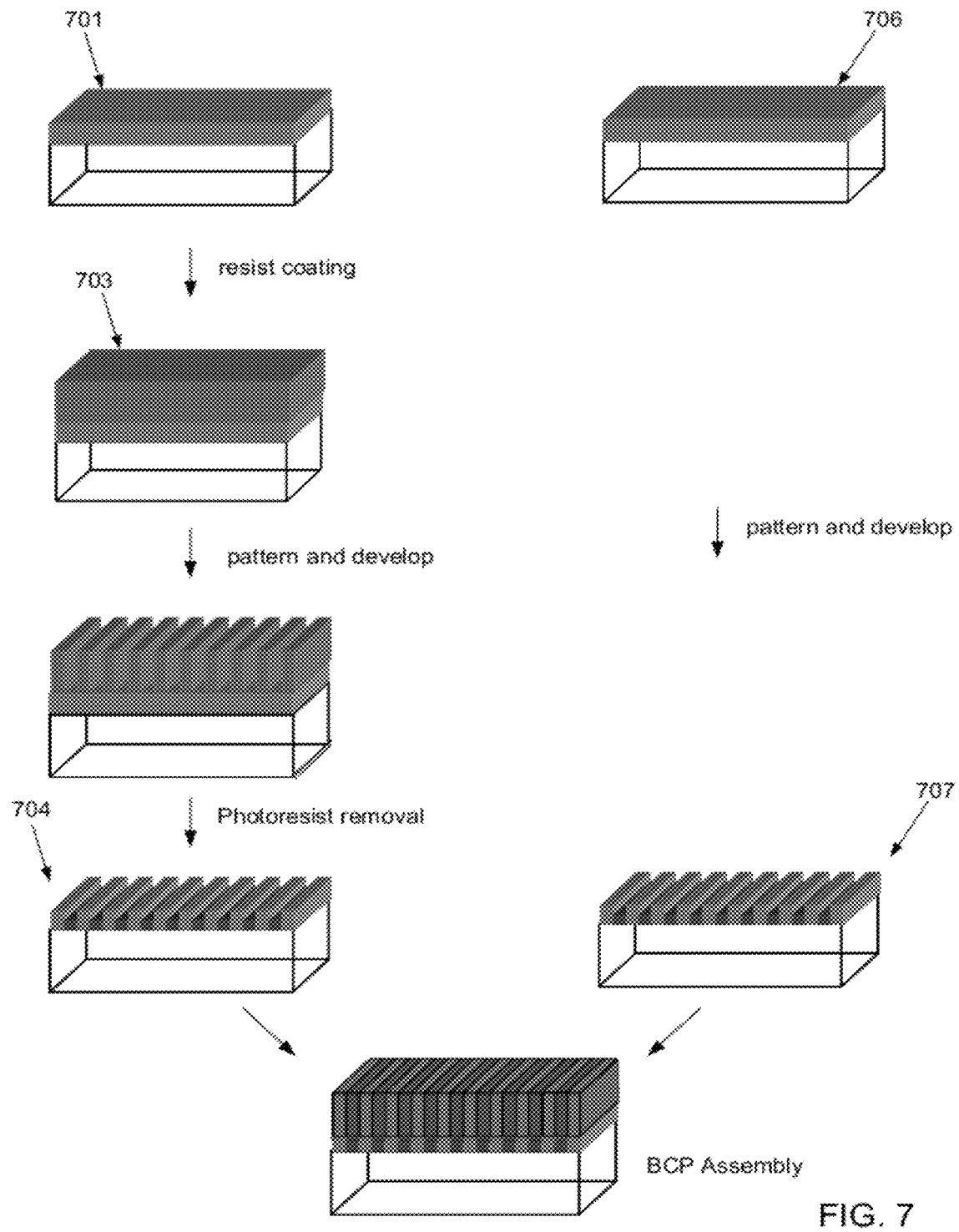
FIG. 7 is a schematic representation of indirect patterning, using resists, and resist-free direct patterning of a preferential imaging layer and subsequent BCP assembly according to certain embodiments.

According to certain embodiments, BCP are ordered by chemical patterns formed by patterning Type I block copolymer brushes. FIG. 7 is a schematic of (a) chemical patterning of random copolymer brushes and (b) direct chemical patterning of Type I block copolymer brushes according to the embodiments described herein. On the left, a process flow for patterning a layer 701 of homopolymer or random copolymer brushes is shown. The process flow is similar to that illustrated in FIG. 5, with the pattern dimensions smaller to match the bulk BCP domain dimensions. Example dimensions are on the order of about few nm to 50 nm. As in FIG. 5, layer 701 is coated with a resist 703, which is then patterned and developed. The physical resist pattern is then transferred to layer 701 by exposure to an oxygen plasma to form patterned layer 704, patterned with regions of polymer brushes and regions of hydroxyl groups.

On the right, direct patterning of a layer 706 of Type I block copolymers is shown. The Type I block brushes of layer 706 are directly exposed to an e-beam in the desired pattern. Upon exposure to e-beam, the A block in the brush undergoes a chain scission reaction, resulting in cleavage of the block brush from the substrate upon subsequent washing. The result is a directly patterned buffer layer 707 with alternating stripes preferential to one of the blocks of the overlying BCP, Assembly of the BCP on the directly patterned buffer layer 707 is the same as that on patterned buffer layer 704: ordered domains of the BCP aligned with the underlying pattern.

EXPERIMENTAL

Figure 8A:
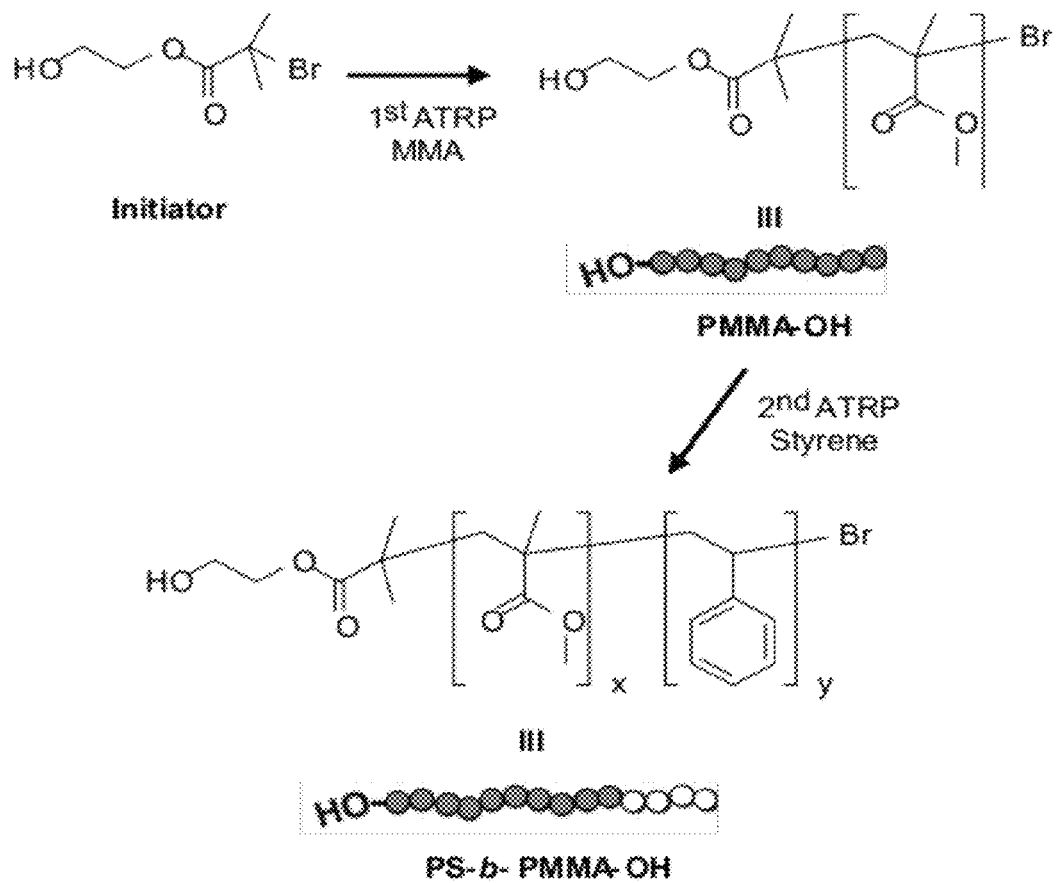
FIG. 8a provides an example of a synthetic scheme for a Type I or Type II block X-A-b-B block copolymer, with an OH anchoring group, a PMMA A block and a PS B block.
Figure 8B:
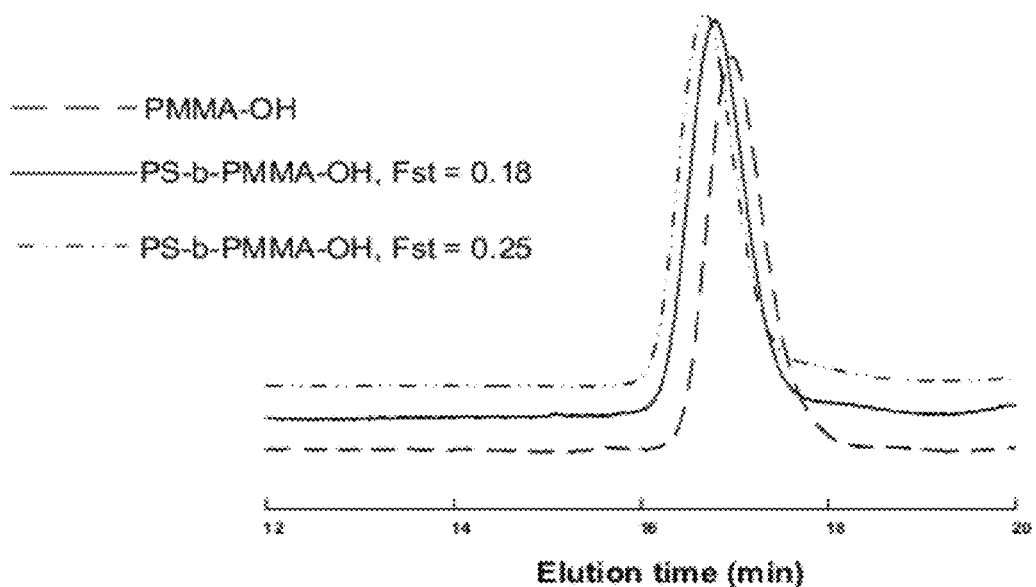
FIG. 8b shows GPC analysis of synthesized Type II polymers.

FIG. 8a provides an example of a synthetic scheme for a Type I or Type II block X-A-b-B block copolymer, with an OH anchoring group, a PMMA A block and a PS B block. Hydroxyl terminated PMMA is synthesized by atom-transfer radical polymerization (ATRP) using a hydroxyl-containing initiator and used as a macroinitiator for the polymerization of styrene as the second block. The chain length of the PS block is tuned to get the desired surface chemical composition of styrene and MMA in the copolymer as discussed above. The molecular weight of block copolymer and hence the increase in PS fraction can be monitored by GPC and NMR. FIG. 8b shows GPC analysis of the synthesized polymers. (PS fraction in the block copolymers was measured by $^1$H NMR). As shown by FIG. 5b, the polymerization is well controlled and the molecular weight increases with increasing PS fraction. Other X-A-b-B Type I or Type II block copolymer brushes may be similarly synthesized. Type III brushes (X-A-b-C; C is B-r-D) may synthesized using X-terminated polymerized A as a macroinitiator for a B-r-D random copolymer.

Example I

Type II PS-b-PMMA-OH block copolymer brushes were synthesized as described with respect to FIG. 8a, Silicon substrates were modified by grafting the PS-b-PMMA-OH polymers by thermal annealing via the terminal hydroxyl group on to the native oxide layer to create a buffer layer. Table 1 summarizes the molecular weight and PDI of these copolymers and the resulting thickness of the modified substrates. Brush thickness increases with the length of PS chain. The surface morphology of brush layer was examined by AFM and does not show phase separation. The root-mean-square (rms) roughness of buffer layer the PS-b-PMMA-OH brush modified surface) was between 0.129 to 0.176 nm, which is comparable to those observed for a random copolymer brush system.

TABLE 1

Non-preferential buffer layer - Type II block copolymer brushes

| Brush | Mn | PDI | Fst | Thickness (nm) |
|---|---|---|---|---|
| PMMA-OH | 11,500 | 1.08 | 0 | 4.7 |
| PS-b-PMMA-OH | 14,400 | 1.08 | 0.10 | 5.2 |
| PS-b-PMMA-OH | 15,300 | 1.07 | 0.18 | 5.3 |
| PS-b-PMMA-OH | 16,200 | 1.09 | 0.25 | 5.5 |

Mn is the number average molecular weight of the block copolymer brushes (measured by GPC using monodisperse PS standard), PDI is the polydispersity and Fst is the fraction of styrene (the B block in example). Thickness of the buffer layer of the buffer layer was measured by ellipsometry.

As indicated above, Type II block copolymer brushes are used in certain embodiments to form non-preferential buffer layers for overlying A-b-B block copolymer layers. In certain embodiments, Mn is between about 2 k and 20 k. At molecular weights greater than this, the Type ii brush layer may undergo phase separation.

Figure 9:
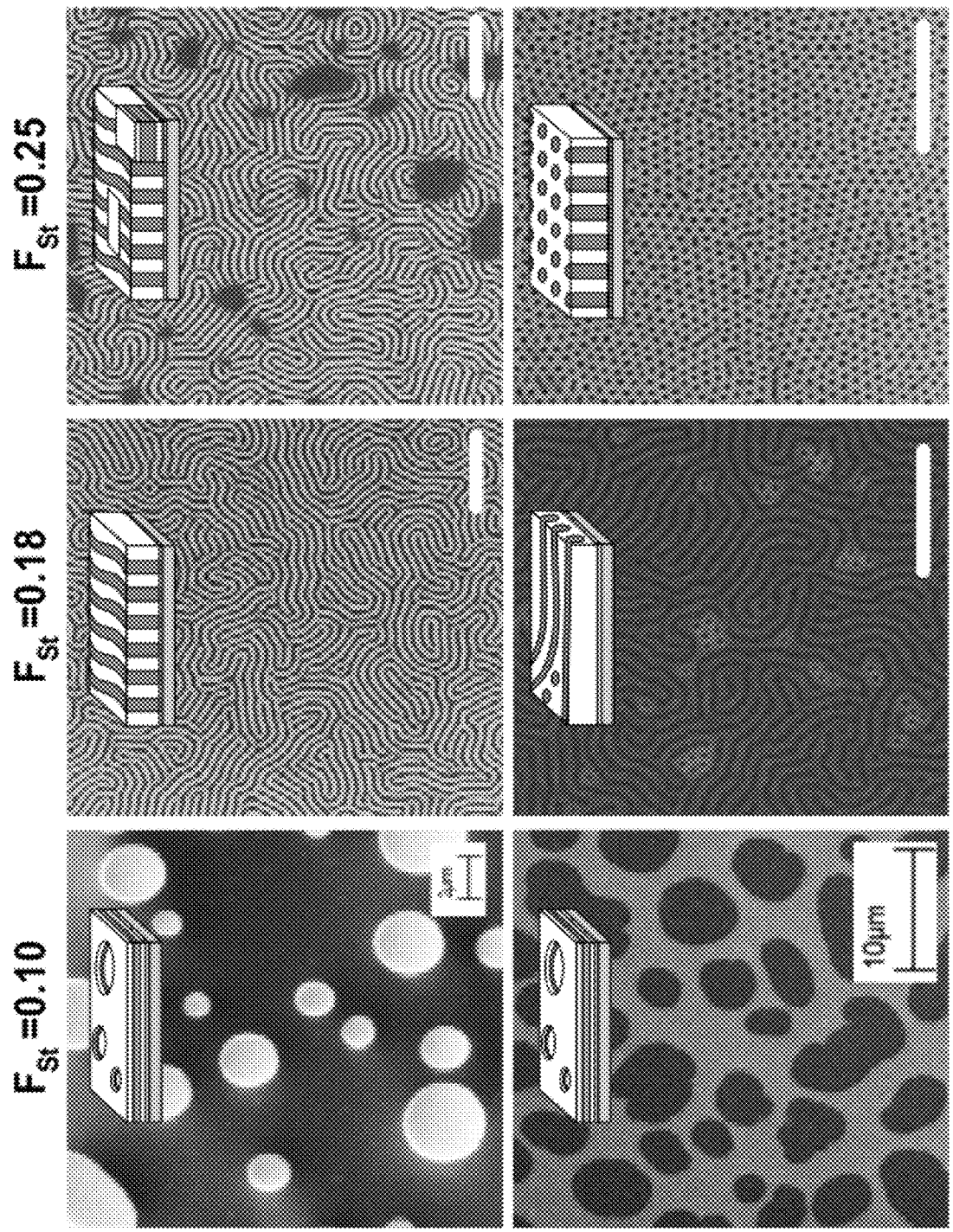
FIG. 9 shows top view SEM images of assembled BCPs on substrates modified according to various embodiments. The top row shows a lamella-forming BCP and the bottom row shows a cylinder-forming BCP on brush-grafted Si substrates.

The compositional dependence of its non-preferentiality of the Type II block copolymer to the overlying BCP was evaluated. The non-preferentiality of the buffer layer was determined for both symmetric and asymmetric PS-b-PMMA. On the modified substrates, 45 nm thick lamella-forming (52 K-52 K) and 32 nm thick of PMMA cylinder-forming (50 K-20 K) BCPs were deposited, followed by thermal annealing at 190° C., under vacuum. FIG. 9 shows top view SEM images of the assembled BCP on the modified substrates. The top row shows the lamella-forming BCP and the bottom row of FIG. 9 shows cylinder-forming BCP on the brush-grafted Si substrates.

The substrate modified with the Type II block brush having $F_{St}$=0.10 induced parallel orientation of domains with terraced structures confirming preferential wetting characteristics for both symmetric and asymmetric PS-b-PMMA. As the PS fraction in the block brush increased to 0.18, typical finger print morphology confirming perpendicular orientation of lamellar domains was observed for the lamella forming PS-b-PMMA. However, the PMMA cylinders in the asymmetric BCP were oriented parallel to the substrate. As the PS fraction in a block brush was further increased to 0.25, mixed parallel and perpendicular lamellae were formed for the symmetric BCP, whereas predominantly perpendicular cylinders were obtained for the asymmetric BCP. These results show that the composition of the block brush can be effectively tuned to create non-preferential buffer layers for different BCPs.

In certain embodiments, the Type II block brushes require a significantly lower fraction of styrene to be effective as a non-preferential buffer layers compared to the random copolymer brushes. For example, a hydroxyl terminated PS-r-PMMA having styrene fraction ranging from 0.45 to 0.60 has been shown to induce perpendicular lamellae in a symmetric BCP with a film with thickness about $L_0$. It is believed that the difference in compositional range for the block brushes described herein is attributable to the difference in the architecture of the buffer layer itself. In the case of the random copolymer buffer layer, distribution of styrene and MMA monomers in a polymer chain is statistically random and there is no significant gradient in composition within the grafted brush layers. In a block copolymer buffer layer, however, sequence of block copolymerization sets one block as a surface rich component. Since the block brush is grafted on the substrate through the hydroxyl group (or other anchoring group) on the PMMA (or other A block) chain end, the short PS block (or other B block) is predominantly located at the BCP/buffer layer interface. Without being bound to a particular theory, it is believed that this causes the effective PS fraction in block brush to be higher than a random copolymer brush at the BCP/buffer layer interface. This is corroborated by both water contact angle measurements and analyzing the surface composition using X-ray photoelectron spectroscopy (XPS) as discussed below.

Figure 10:
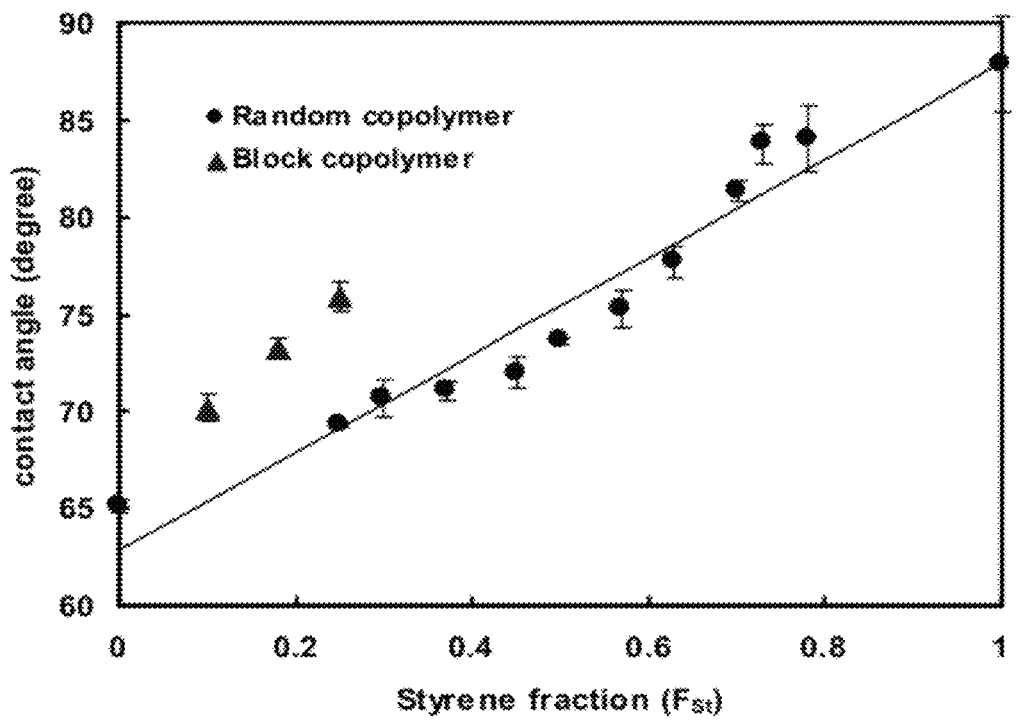
FIG. 10 is graph of contact angles of buffer layers composed of random copolymer and buffer layers composed of Type II block brushes.
Figure 11:
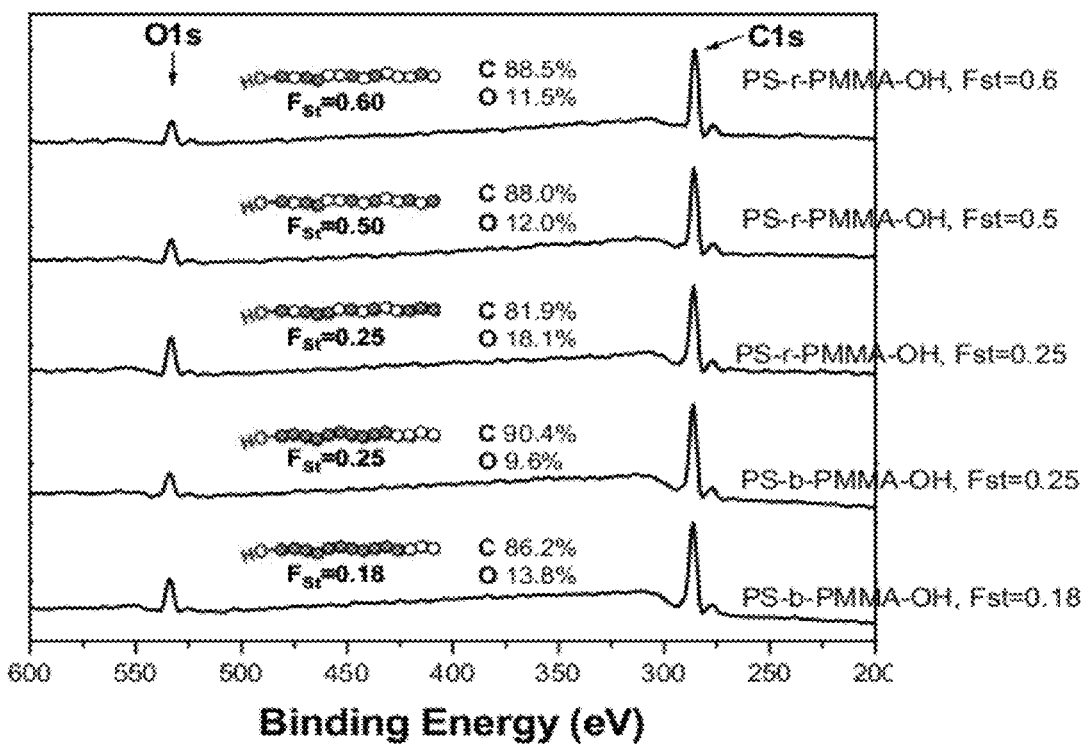
FIG. 11 provides X-ray photoelectron spectroscopy (XPS) results of buffer layers composed of random copolymers and buffer layers composed of Type II block brushes.

Water contact angles were measured for the modified substrates to assess the relative surface compositions. As shown in FIG. 10, the contact angles of buffer layers composed of random copolymer increases monotonically with the styrene fraction, whereas those for the buffer layers composed of the block brush with equivalent styrene fractions are significantly higher. For example, the contact angle of buffer layer with block brush having FSt=0.25 is similar to those of random brush having FSt range of 0.57~0.63. FIG. 11 shows the XPS results, which show similar trends. The intensity of C1s peaks of block brushes is comparable to those for random brushes with higher FSt. This shows that the block brush presents a higher effective styrene content at the buffer layer/BCP interface compared to same composition of a random brush. The water contact angles, AFM and XPS results confirm that a relatively short PS block effectively prevents microphase separation and leads to the desired homogeneous distribution of MMA and St on the surface leading to a non-preferential wetting behavior at significantly lower styrene content compared to the random copolymer buffer layer.

Figure 12:
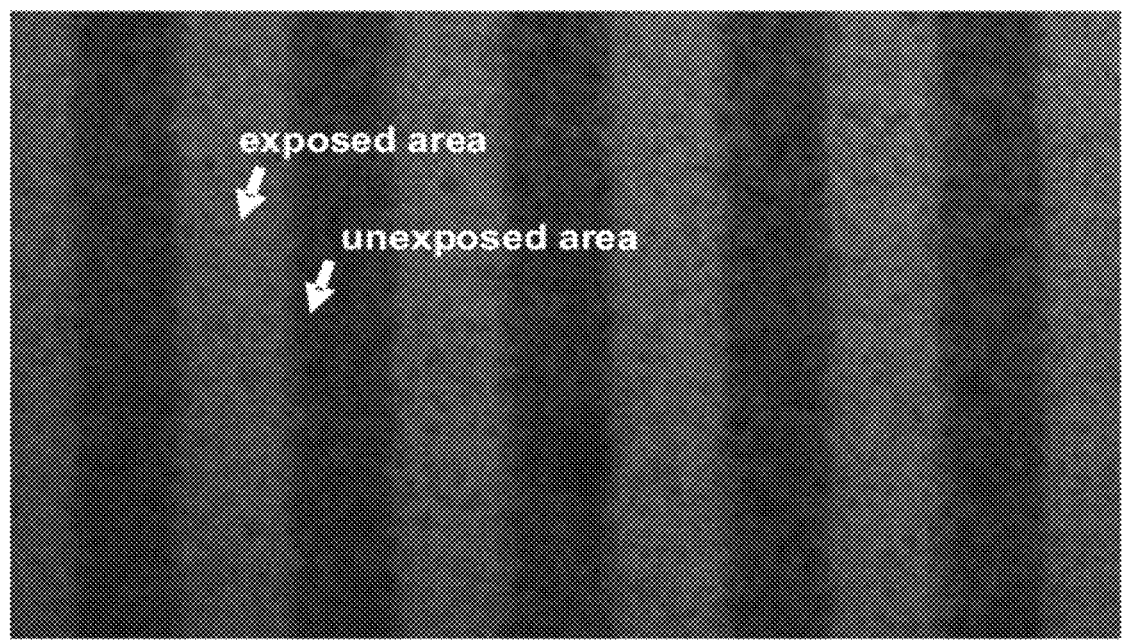
FIG. 12 is a top view of an SEM image of a directly patterned buffer layer according to certain embodiments.

Block brushes ($F_{St}$=0.18 for symmetric BCP and $F_{St}$=0.25 for asymmetric BCP) were directly patterned with 200 nm width stripes by e-beam with area doses ranging from 34 to 340 μC/cm². The block brush had a majority of PMMA block (75~82%) anchored to the substrate and a small fraction of PS block at the surface, and was sensitive to e-beam. Direct patterning of the buffer layer results in its removal from the exposed region. FIG. 12 is a top view of an SEM image of a directly patterned layer; the contrast in the SEM confirms the patterning of the buffer layer. Height differences seen from AFM images (not shown) also confirm that the layer was directly patterned.

Figure 13A:
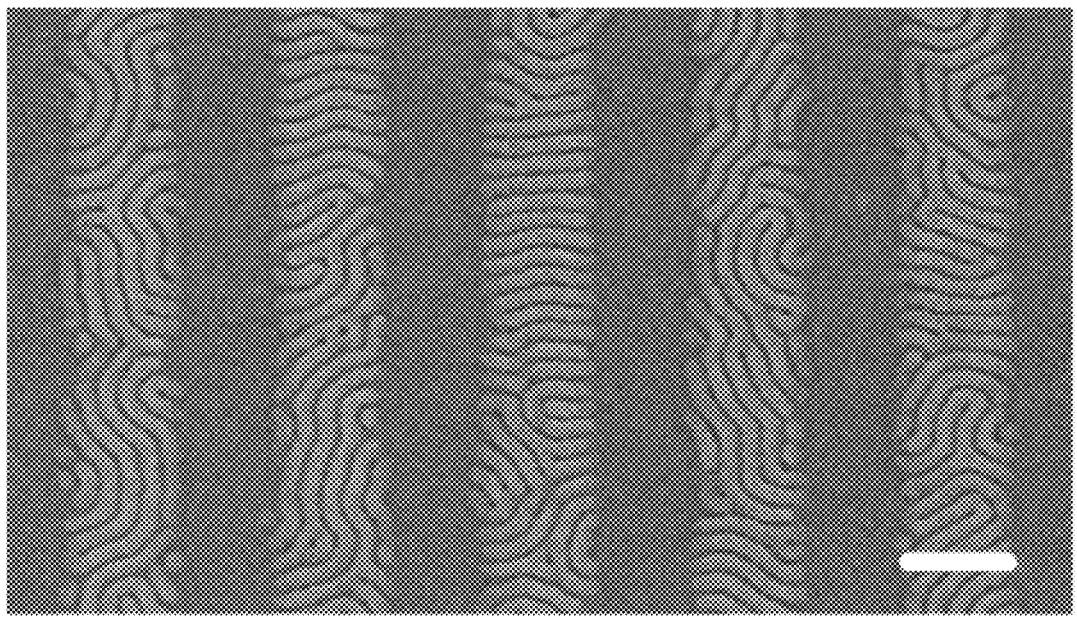
FIG. 13a is a top view SEM image of an assembled lamella-forming BCP on a directly patterned non-preferential buffer layer of block brushes described herein.
Figure 13B:
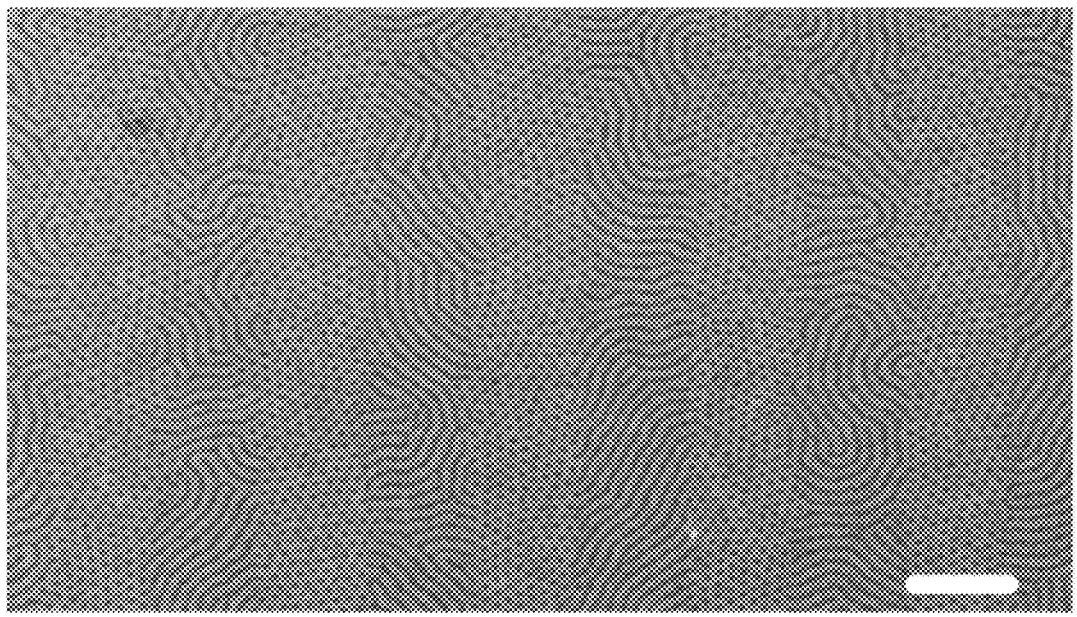
FIG. 13b is a top view SEM image of an assembled cylinder-forming BCP on a directly patterned non-preferential buffer layer of block brushes described herein.

Lamella-forming and cylinder forming BCP were assembled on directly patterned layers. FIG. 13a is a top view SEM image of an assembled lamella-forming BCP and FIG. 13b is a top view SEM image of the cylinder-forming BCP. Clear switching of the wetting behavior toward the overlying BCP from non-preferential to preferential is shown in FIGS. 13a and 13b.

Example II

A buffer layer of a Type II block brush having Fst=0.25 was formed on a topographical substrate and directly patterned by e-beam, as illustrated schematically in FIG. 6a. Directed assembly of cylinder-forming BCP using the resulting chemically and topographically patterned substrate created both aligned line and dot arrays within the trench; FIG. 6b provides a top down SEM image.

Example III

Figure 14:
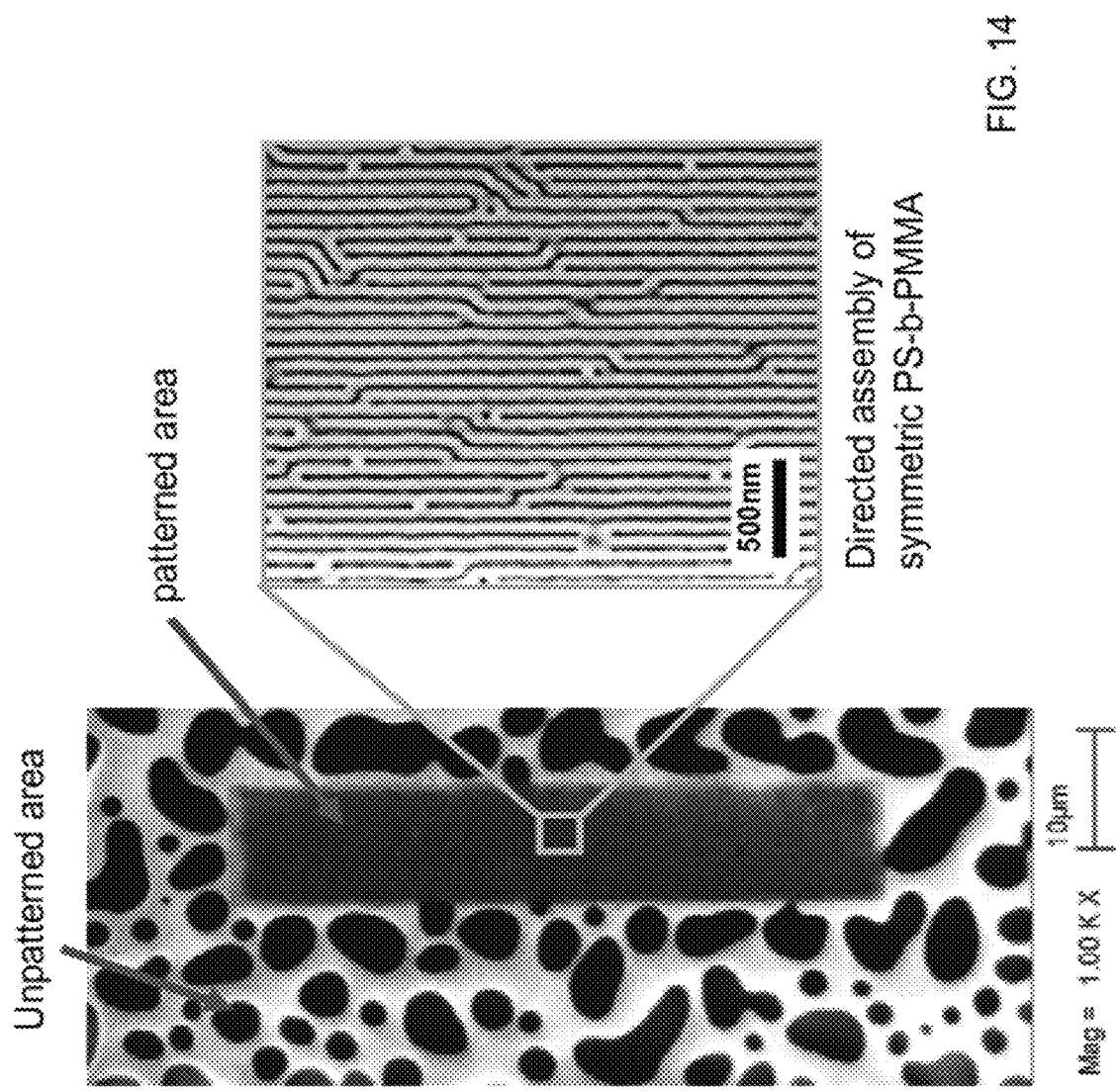
FIG. 14 is a top view SEM image of an assembled ordered lamella-forming BCP on a directly patterned preferential buffer layer of block brushes described herein.

Type I PS-b-PMMA-OH block brushes having Mn=65 kg/mol and Fst of 0.85 were synthesized as described above, and grafted to silicon substrates, to form imaging layers. The layers were directly patterned via e-beam (e-beam dose 0.12 to 0.32 nC/cm) to form alternating stripes, having an $L_s$ (line pitch) of 72 nm-80 nm. Symmetric PS-b-PMMA having Lo of 76 nm was directed to assemble on the patterned imaging layer. FIG. 14 provides top down SEM images of the patterned substrate, and the assembled BCP film. The images show that the directly patterned Type I brush is able to direct the assembly of ordered structures.

Example IV

PS-b-PMMA-OH block brushes were synthesized by ATRP. The synthesized polymers were thermally grafted on silicon oxide surface to create modified substrates. Characteristics of the synthesized polymers and polymer grafted surfaces are summarized in Table 2. The PS-b-PMMA-OH block copolymer with a $M_n$ of 16,200 kg/mol (Fps=0.25) is referred to as 16SM below, with the PS-b-PMMA-OH block copolymer with a $M_n$ of 18,200 kg/mol (Fps=0.34) referred to as 18SM. Macroscopic wetting properties of the modified surface from water contact angle measurements show that the surface grafted with 18SM presents a hydrophobic surface similar to surfaces modified with PS homopolymers.

TABLE 2

Characteristics of the synthesized polymers and polymer grafted surfaces

| Polymer | Mn (kg/mol) | thickness (nm) | PS Fraction ($F_{PS}$) | Water contact angle |
|---|---|---|---|---|
| PMMA-OH | 11 500 | 4.7 | 0 | 65° |
| PS-b-PMMA-OH (16SM) | 16 200 | 5.5 | 0.25 | 76° |
| PS-b-PMMA-OH (18SM) | 18 200 | 7.5 | 0.34 | 86° |
| PS-OH | 6 500 | 4.3 | 1 | 88° |

Figure 15:
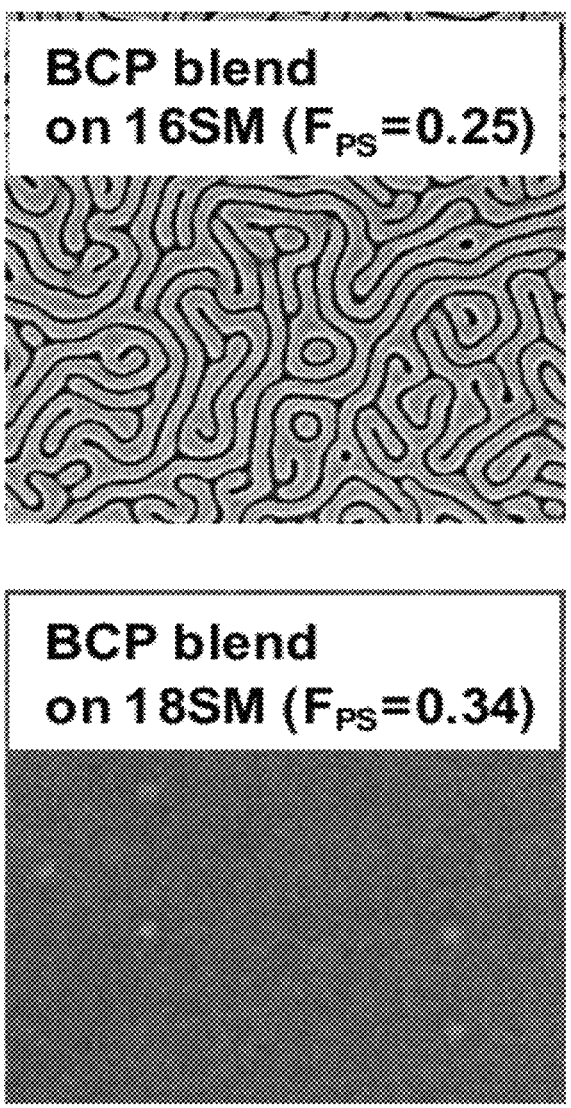
FIG. 15 shows SEM images of thin film assembly of a lamella-forming BCP ternary blend on PS-b-PMMA-OH grafted substrates.

The total molecular weight was controlled to be below the phase segregation limit of about 20 kg/mol. Post thermal annealing, the block copolymer grafted surfaces did not show any discernible phase separation. FIG. 15 shows SEM images of thin film assembly of a lamella-forming BCP ternary blend (PS-b-PMMA (52 K-52 K)/PS (49 K)/PMMA (50 K) (0.7/0.15/0.15 wt %) on PS-b-PMMA-OH grafted substrates. The images confirm non-preferential (16SM, FPS=0.25) and preferential (18SM, FPS=0.34) wetting conditions as seen by the fingerprint pattern generated by vertical lamellae (assembled on 16SM) and the holes/islands featureless surface generated by parallel lamellae (assembled on 18SM), respectively. Fast Fourier transform (FFT) of fingerprint pattern on nonpreferential block brush 16SM gave a 70 nm domain spacing (Lo). A 1:1 chemical pattern i.e. a guiding stripe with a periodicity Ls of 70 nm can be easily accessed by conventional e-beam lithography.

Figure 16:
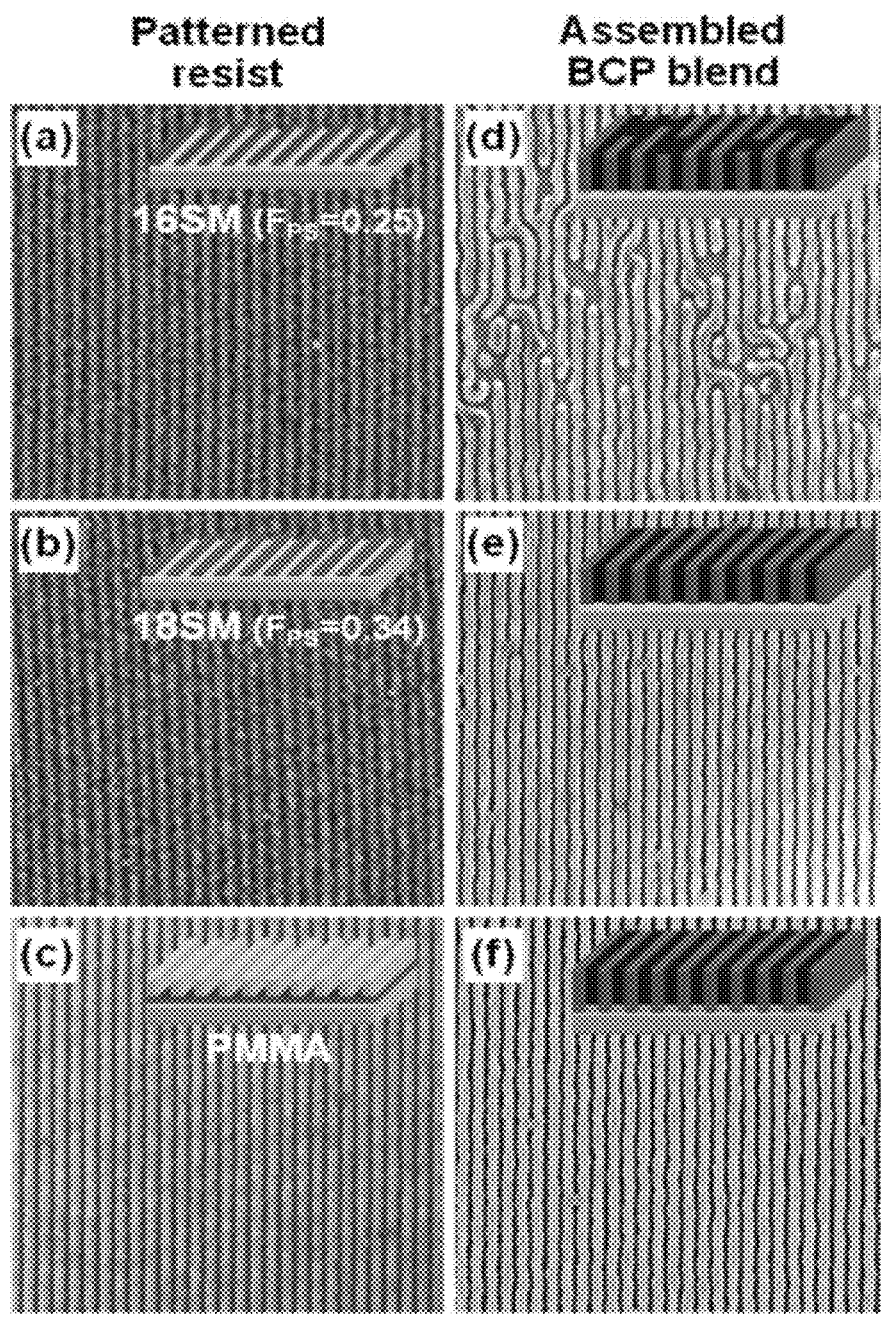
FIGS. 16 and 17 shows AFM and SEM images of patterned resists and blend films assembled on the patterned resists.

The grafted BCP resists were subjected to direct EBL to fabricate chemical patterns for directed assembly of the BCP ternary blend. Panels (a) and (b) of FIG. 16 show the AFM height images of a 70 nm pitch line array of patterned BCP resist. As a comparison, traditional PMMA resist was patterned on a PS grafted substrate. Panel (c) shows the SEM image of patterned PMMA resist after development. The line doses of e-beam to create a clear line pattern were between about 0.12 and 0.6 nC/cm for grafted BCP, lower than that for PMMA resist (between about 0.4 and 1 nC/cm). Panels (d)-(f) show the assembled BCP ternary blend on chemically patterned surfaces. While the chemical pattern created from 18SM ($F_{ps}$=034) shows directed assembly with a small number of defects (Panel (e)), comparable to those obtained by patterning grafted PS brush with PMMA resist (Panel (f)), assembly on a chemical pattern from a 16SM ($F_{PS}$=0.24) BCP resist is poorer. The defect density in the assembled structure is a strong function of the chemical contrast created between the guiding stripe and the background of the patterned substrate. The chemical pattern fabricated by direct EBL of the anchored 16SM and 18SM BCPs results in a PMMA preferential guiding stripe in both cases, while the background is non-preferential for 16SM and PS preferential for 18SM. The larger chemical contrast in the chemical pattern generated by 18SM leads to lesser defect density in the assembled BCP. These results confirm that basic assembly rules are still followed with the direct EBL, patternable BCPs resists, while the processing is tremendously simplified.

For a 18SM BCP resist, a line dose between 0.33 and 0.48 nC/cm resulted in directed assembly while the PMMA resist required a line dose of 0.68 to 0.89 nC/cm. The difference in dose range between grafted PS-b-PMMA and PMMA resist can be attributable to the (i) molecular weight of PMMA segment, and (ii) the thickness of PMMA layer. The lower molecular weight (11 K) and thinner layer (about 4 nm) of the PMMA block in a grafted PS-b-PMMA leads to higher sensitivity toward e-beam compared to traditional resist (950 K and 40 nm thick). Thus by using surface grafted BCP resist, e-beam writing process can be accomplished in a shorter time.

Example V

Figure 17:
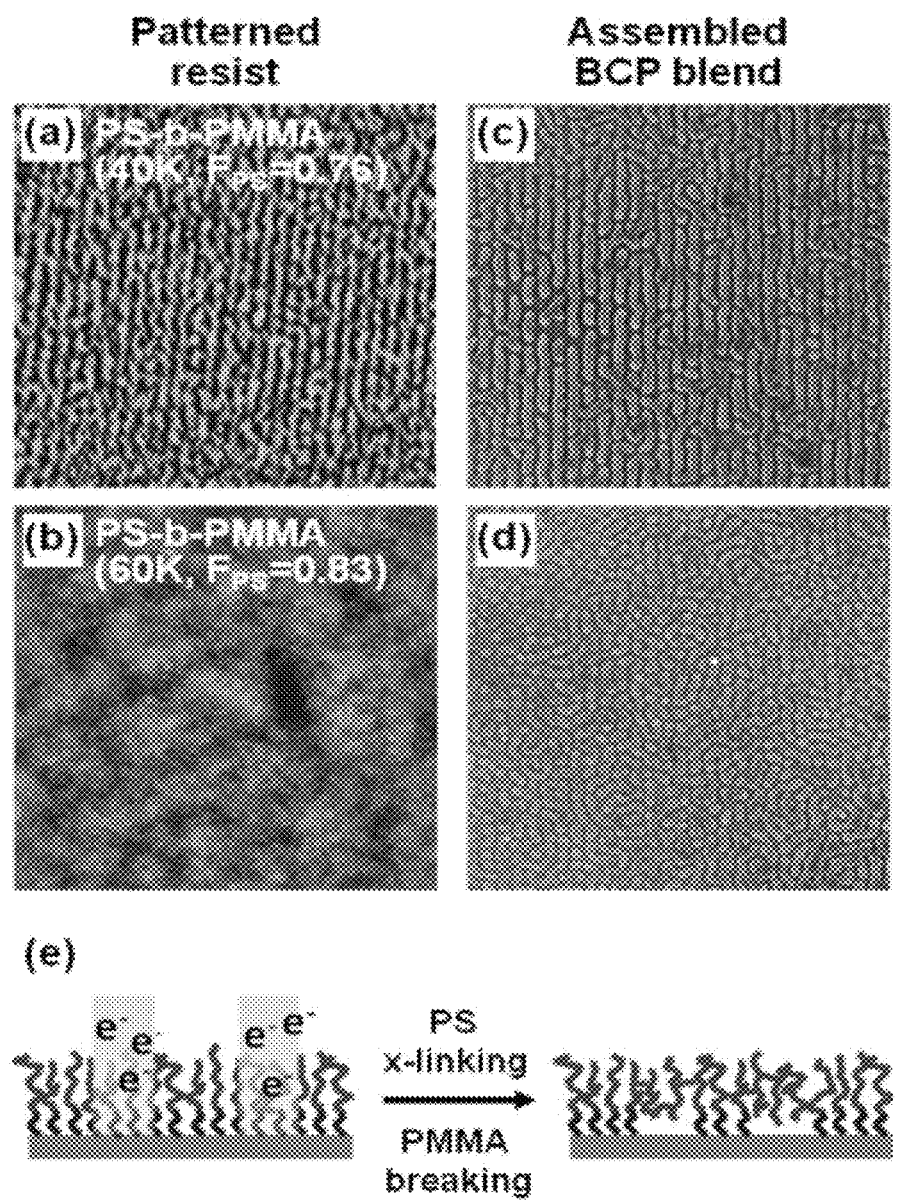

E-beam exposure can induce crosslinking in PS, which has been used as a negative tone e-beam resist. E-beam patterning of the 16SM and 18SM polymers did not result in observable cross-linking, which may be due to the relatively low total molecular weights (about 16 to 18 kg/mol) and the relatively low PS fractions (about 0.25 to 0.34) in the grafted BCP resist. Furthermore, since the molecular weight of the chains are below the phase segregation limit, the small PS patches (PS block is about 4 to 6 kg/mol) are homogeneously mixed with the PMMA block. This may be further prevent the crosslinking of PS (within exposed areas) and with neighboring PS (within unexposed areas). To understand the effect of PS fraction (or chain length) on crosslinking with neighboring PS and the quality of chemical pattern, the chain length of PS was increased while keeping the molecular weight of PMMA the same. Two additional PS-b-PMMA-OH brushes having molecular weights of 40 K ($F_{PS}$=0.76) and 60 K ($F_{PS}$=0.83) were synthesized and EBL was performed using the same conditions as in Example IV. FIG. 17 shows AFM height mode images of the e-beam patterned block copolymers (Panels (a) and (b)), top view SEM images of assembled ternary blend (Panels (c) and (d)), and a schematic illustration of PS crosslinking (Panel (e)). These result clearly shows that as the PS fraction increases the line pattern becomes blurred (Panel (a)) and ultimately ineffective in guiding the BCP assembly (Panel (b)). Therefore, controlling the molecular weight and composition of block copolymer based resist is critical to creating well-defined chemical patterns for the directed assembly of BCPs and BCP blends.

The examples demonstrates the use of a single component e-beam sensitive resist to create a 1:1 chemical pattern for directed assembly of a block copolymer. In the provided examples, the resist includes a surface grafted PS-b-PMMA. Since PS and PMMA can be used as a negative and positive tone e-beam resist respectively, controlling the relative lengths of the two blocks and the overall molecular weight of the resist is critical for achieving directed assembly of BCPs. In the examples above, the BCP resist has a 1) molecular weight below 20 K, and 2) PS fraction of 0.32 which suppresses any lateral phase segregation of the domains and creates a PS preferential substrate. The PMMA block provides enough sensitivity to allow scission by e-beam resulting in a chemical pattern with enough contrast to allow 1:1 assembly of a ternary blend of BCP with its corresponding homopolymers. For creating chemical patterns for guiding BCP assembly, it is not just the periodicity of the pattern that is important but also the surface wetting characteristics need to be finely tuned. The direct EEL patterning avoids contact with the photoresist (PMMA), photo generated acid and developer solution and hence offers a more predictable control over the chemical contrast generated in the chemical pattern. Here we have demonstrated a pattern with $L_s$ is close to $L_o$, but creating the sparse chemical pattern for the density multiplication is possible using the same approach.

Although the foregoing invention has been described in some detail for purposes of clarity of understanding, it will be apparent that certain changes and modifications may be practiced within the scope of the invention. It should be noted that there are many alternative ways of implementing both the processes and apparatuses of the present invention. Accordingly, the present embodiments are to be considered as illustrative and not restrictive, and the invention is not to be limited to the details given herein.

What is claimed is:

1. An X-A-b-B block copolymer comprising a terminal B block; a methacrylate-containing A block, and a terminal anchoring group X, wherein the number average molecular weight of the block copolymer is less than about 30 kg/mol and the B block mole fraction in the block copolymer is between about 0.15 and 0.4, wherein the block copolymer is attached via the anchoring group to a substrate.

2. The block copolymer of claim 1 wherein the B block is selected from the group consisting of PS, P2VP, PV4P, PEO, and PDMS.

3. The block copolymer of claim 1 wherein the A block is selected from the group consisting of PMMA, PHEMA, PHEMA-TMS, PIBMA, PNPMA and PTFEMA.

4. The block copolymer of claim 1 wherein the number average molecular weight of the block copolymer is less than about 25 kg/mol.

5. The block copolymer of claim 1 wherein the number average molecular weight of the block copolymer is less than about 20 kg/mol.

6. The block copolymer of claim 1 wherein the number average molecular weight of the block copolymer is less than about 15 kg/mol.

7. The block copolymer of claim 1 wherein the anchoring group is selected from the group consisting of a hydroxyl group, a thiol group, an azide group, a carboxylic acid group, an amide group, an amine group, an epoxide group, a vinyl group, and a trichlorosilane group.

8. The block copolymer of claim 1 wherein the B block mole fraction is less than about 0.35.

9. The block copolymer of claim 1 wherein the B block mole fraction is less than about 0.3.

10. The block copolymer of claim 1 wherein the B block mole fraction is less than about 0.25.

11. The block copolymer of claim 1 wherein the B block mole fraction is less than about 0.2.

12. An X-A-b-B block copolymer comprising a terminal B block; a methacrylate-containing A block, and a terminal anchoring group X, wherein the number average molecular weight of the block copolymer is between about 10 and 80 kg/mol and the B block mole fraction in the block copolymer is between about 0.3 and 0.9 and wherein the B block is a homopolymer, wherein the block copolymer is attached via the anchoring group to a substrate.

13. The block copolymer of claim 12 wherein the B block is selected from the group consisting of PS, P2VP, PV4P, PEO, and PDMS.

14. The block copolymer of claim 12 wherein the A block is selected from the group consisting of PMMA, PHEMA, PHEMA-TMS, PIBMA, PNPMA and PTFEMA.

15. The block copolymer of claim 12 wherein the number average molecular weight of the block copolymer is less than about 30 kg/mol.

16. The block copolymer of claim 12 wherein the number average molecular weight of the block copolymer is less than about 25 kg/mol.

17. The block copolymer of claim 12 wherein B block mole fraction in the block copolymer is between about 0.3 and 0.75.

18. The block copolymer of claim 12 wherein the number average molecular weight of the block copolymer is greater than about 30 kg/mol.

19. The block copolymer of claim 12 wherein the number average molecular weight of the block copolymer is greater than about 40 kg/mol.

20. The block copolymer of claim 12 wherein the anchoring group is selected from the group consisting of a hydroxyl group, a thiol group, an azide group, a carboxylic acid group, an amide group, an epoxide group, a vinyl group, and a trichlorosilane group.

21. An X-A-b-C block copolymer comprising a terminal C block; a methacrylate-containing A block, and a terminal anchoring group X, wherein the A block is a homopolymer, wherein the C block is a B-r-D random copolymer, and wherein the number average molecular weight of the block copolymer is between about 10 and 80 kg/mol, the C block mole fraction in the block copolymer is between about 0.4 and 0.9 and the B mole fraction in the C block is between about 0.1 and 0.9, wherein the block copolymer is attached via the anchoring group to a substrate.

22. An X-A-b-C block copolymer comprising a terminal C block; a methacrylate-containing A block, and a terminal anchoring group X, wherein the A block is a homopolymer, wherein the C block is a B-r-D random copolymer, and wherein the number average molecular weight of the block copolymer is between about 10 and 80 kg/mol, the C block mole fraction in the block copolymer is between about 0.4 and 0.9 and the B mole fraction in the C block is between about 0.1 and 0.9, wherein the C block is selected from the group consisting of PS-r-PMMA, PS-r-P2VP, PS-r-P4VP, PS-r-PEO, and PS-r-PDMS.

23. The block copolymer of claim 22 wherein the block copolymer is attached via the anchoring group to a substrate.

\* \* \* \* \*